United States Patent
Sekiguchi et al.

(10) Patent No.: US 11,136,496 B2
(45) Date of Patent: Oct. 5, 2021

(54) PHOSPHOR-CONTAINING FILM AND BACKLIGHT UNIT

(71) Applicant: FUJIFILM Corporation, Tokyo (JP)

(72) Inventors: Megumi Sekiguchi, Kanagawa (JP); Tatsuya Oba, Kanagawa (JP); Kenichi Kakishita, Kanagawa (JP); Masayuki Kusumoto, Kanagawa (JP); Natsuru Chikushi, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 225 days.

(21) Appl. No.: 16/287,256

(22) Filed: Feb. 27, 2019

(65) Prior Publication Data

US 2019/0194530 A1 Jun. 27, 2019

Related U.S. Application Data

(63) Continuation of application No. PCT/JP2017/031111, filed on Aug. 30, 2017.

(30) Foreign Application Priority Data

| Sep. 2, 2016 | (JP) | JP2016-172180 |
| Nov. 30, 2016 | (JP) | JP2016-233275 |
| May 19, 2017 | (JP) | JP2017-099573 |

(51) Int. Cl.
    *C09K 11/02* (2006.01)
    *F21V 8/00* (2006.01)
    (Continued)

(52) U.S. Cl.
    CPC .............. *C09K 11/02* (2013.01); *C09K 11/70* (2013.01); *G02B 5/201* (2013.01); *G02B 6/005* (2013.01); *H01L 33/50* (2013.01); *C09K 11/56* (2013.01)

(58) Field of Classification Search
    CPC .................................................. C09K 11/70
    See application file for complete search history.

(56) References Cited

U.S. PATENT DOCUMENTS

| 2010/0051898 A1 | 3/2010 | Kim et al. |
| 2011/0037926 A1 | 2/2011 | Tsukahara et al. |

(Continued)

FOREIGN PATENT DOCUMENTS

| JP | 2009-283441 A | 12/2009 |
| JP | 2010-061098 A | 3/2010 |

(Continued)

OTHER PUBLICATIONS

Office Action, issued by the Korean Intellectual Property Office dated Mar. 30, 2020, in connection with Korean Patent Application No. 10-2019-7005854.

(Continued)

*Primary Examiner* — Ian A Rummel
(74) *Attorney, Agent, or Firm* — Jean C. Edwards, Esq.; Edwards Neils LLC

(57) ABSTRACT

A phosphor-containing film contains a phosphor such as a quantum dot and is capable of suppressing deterioration of phosphor even where the film is formed into a laminated structure; and a backlight unit including the phosphor-containing film as a wavelength converting member. The film includes: a phosphor-containing layer in which a plurality of fluorescent regions, each of which contains a phosphor that deteriorates through reaction with oxygen when exposed to oxygen, are discretely arranged and a resin layer having impermeability to oxygen is arranged among the plurality of the discretely arranged fluorescent regions; and a first substrate film and a second substrate film, which are respectively laminated on both main surfaces of the phosphor-containing layer, in which the resin layer has a Knoop hardness of 115 N/mm$^2$ to 285 N/mm$^2$, a creep recovery rate of 22% or less, and an elastic recovery rate of 60% or more.

5 Claims, 8 Drawing Sheets

(51) Int. Cl.
*C09K 11/70* (2006.01)
*H01L 33/50* (2010.01)
*G02B 5/20* (2006.01)
*C09K 11/56* (2006.01)

(56) References Cited

U.S. PATENT DOCUMENTS

| | | | |
|---|---|---|---|
| 2015/0048403 A1 | 2/2015 | Dan et al. | |
| 2015/0368553 A1 | 12/2015 | Nelson et al. | |
| 2017/0321115 A1 | 11/2017 | Satake et al. | |
| 2018/0208841 A1* | 7/2018 | Palazzotto | C09K 11/703 |

FOREIGN PATENT DOCUMENTS

| | | | |
|---|---|---|---|
| JP | 2015-061759 A | 4/2015 |
| JP | 2016-511709 A | 4/2016 |
| JP | 2016-143562 A | 8/2016 |
| JP | 2016-194552 A | 11/2016 |
| JP | 2016-194558 A | 11/2016 |
| JP | 2016-194561 A | 11/2016 |
| WO | 2015/024008 A1 | 2/2015 |
| WO | 2015/095296 A1 | 6/2015 |
| WO | 2016/125479 A1 | 8/2016 |

OTHER PUBLICATIONS

Office Action, issued by the State Intellectual Property Office dated Sep. 24, 2020, in connection with Chinese Patent Application No. 201780053700.9.
Office Action, issued by the Japanese Patent Office dated Dec. 17, 2019, in connection with Japanese Patent Application No. 2018-537334.
International Search Report issued in PCT/JP2017/031111 dated Nov. 21, 2017.
Written Opinion issued in PCT/JP2017/031111 dated Nov. 21, 2017.
International Preliminary Report on Patentability completed by WIPO dated Mar. 5, 2019, in connection with International Patent Application No. PCT/JP2017/031111.

* cited by examiner

PHOSPHOR-CONTAINING FILM AND BACKLIGHT UNIT

CROSS-REFERENCE TO RELATED APPLICATIONS

This application is a Continuation of PCT International Application No. PCT/JP2017/031111 filed on Aug. 30, 2017, which was published under PCT Article 21(2) in Japanese, and which claims priority under 35 U.S.C. § 119(a) to Japanese Patent Application No. 2016-172180, filed on Sep. 2, 2016, Japanese Patent Application No. 2016-233275, filed on Nov. 30, 2016 and, Japanese Patent Application No. 2017-099573, filed on May 19, 2017. The above applications are hereby expressly incorporated by reference, in their entirety, into the present application.

BACKGROUND OF THE INVENTION

1. Field of the Invention

The present invention relates to a phosphor-containing film containing phosphors that emit fluorescence upon irradiation with excitation light and a backlight unit comprising the phosphor-containing film as a wavelength converting member.

2. Description of the Related Art

Applications of a flat panel display such as a liquid crystal display (LCD) as a space-saving image display device with low power consumption have been widespread year by year. In recent liquid crystal displays, further power saving, an enhancement in color reproducibility, or the like is required as an improvement in LCD performance.

Along with power saving of LCD backlight, in order to increase the light utilization efficiency and improve the color reproducibility, it has been proposed to use a wavelength converting layer containing a quantum dot (QD, also referred to as a quantum point) that converts a wavelength of an incidence ray and emits the wavelength-converted light, as a luminescent material (phosphor).

The quantum dot has a state of an electron whose movement direction is restricted in all directions three-dimensionally. In the case where nanoparticles of a semiconductor are three-dimensionally surrounded by a high potential barrier, the nanoparticles become quantum dots. The quantum dot expresses various quantum effects. For example, a "quantum size effect" is expressed in which a density of electronic states (energy level) is discretized. According to this quantum size effect, the absorption wavelength and luminescence wavelength of light can be controlled by changing the size of a quantum dot.

Generally, such quantum dots are dispersed in a resin or the like, and used as a quantum dot film for wavelength conversion, for example, by being disposed between a backlight and a liquid crystal panel.

In the case where excitation light is incident from a backlight to a film containing quantum dots, the quantum dots are excited to emit fluorescence. Here, white light can be realized by using quantum dots having different luminescence properties and causing each quantum dot to emit light having a narrow half-width of red light, green light, or blue light. Since the fluorescence by the quantum dot has a narrow half-width, wavelengths can be properly selected to thereby allow the resulting white light to be designed so that the white light is high in luminance and excellent in color reproducibility.

Meanwhile, there are problems that quantum dots are susceptible to deterioration due to moisture or oxygen, and particularly the luminescence intensity thereof decreases due to a photooxidation reaction. Therefore, the wavelength converting member is configured in such a manner that gas barrier films are laminated on both main surfaces of a resin layer containing quantum dots (hereinafter, also referred to as a "quantum dot layer") which is a wavelength converting layer containing quantum dots, thereby protecting the quantum dot layer.

However, merely protecting both main surfaces of the quantum dot layer with gas barrier films has a problem in which moisture or oxygen enters from the end face not protected by the gas barrier film, and therefore the quantum dots deteriorate.

Therefore, it has been proposed to protect the entire periphery of the quantum dot layer with a barrier film.

For example, JP2010-061098A discloses a quantum point wavelength converting structure including a wavelength converting portion containing quantum points for wavelength-converting excitation light to generate wavelength-converted light and a dispersion medium for dispersing the quantum points, and a sealing member for sealing the wavelength converting portion, in which the wavelength converting portion is disposed between two sealing sheets which are sealing members, and the peripheries of the wavelength converting portion in the sealing sheets are heated and thermally adhered to each other, thereby sealing the wavelength converting portion.

Further, JP2009-283441A discloses a light emitting device comprising a color conversion layer (phosphor layer) for converting at least a part of color light emitted from a light source portion into another color light and a water impermeable sealing sheet for sealing the color conversion layer, and discloses a color conversion sheet (phosphor sheet) in which penetration of water into the color conversion layer is prevented by a configuration where the sheet has a second bonding layer provided in a frame shape along the outer periphery of the phosphor layer, that is, so as to surround the planar shape of the color conversion layer, and the second bonding layer is formed of an adhesive material having water vapor barrier properties.

Meanwhile, the wavelength converting layer containing quantum dots used for LCDs is a thin film of about 50 μm to 350 μm in thickness. There are problems that it is extremely difficult to coat the entire end face of such a very thin film with a sealing sheet such as a gas barrier film, thereby leading to poor productivity.

Such problems occur not only in quantum dots, but also in a phosphor-containing film comprising a phosphor which reacts with oxygen and deteriorates.

On the other hand, in order to produce a phosphor-containing film containing a phosphor such as a quantum dot with high production efficiency, preferred is a method of sequentially carrying out a coating step and a curing step on a long film by a roll-to-roll method to form a laminated structure and then cutting the resulting structure to a desired size.

However, in the case of obtaining a phosphor-containing film of a desired size by cutting from this long film, the phosphor-containing layer is again exposed to the outside air at the cut end face, so it is necessary to take measures against entry of oxygen from the cut end face.

On the other hand, US2015/048403A discloses an optical component including two substrates, and a sealing material forming a plurality of separated regions, and a fluorescent member including a fluorescent substance arranged in the separated region that are laminated between the two substrates, and also discloses that, by cutting at the sealing material portion, the sealed state of the fluorescent member can be maintained even in the case where the optical component is cut.

SUMMARY OF THE INVENTION

However, even in the case of a configuration in which the fluorescent member is discretely arranged and scaled with a sealing material, it was found that there is a problem that cracks are generated in the sealing material and therefore moisture and oxygen are likely to penetrate, in the case where the optical component is cut.

The present invention has been made in view of the above circumstances, and an object of the present invention is to provide a phosphor-containing film which contains a phosphor such as a quantum dot and is capable of suppressing the deterioration of the phosphor even in the case where the film is formed into a laminated structure, which is then cut into a desired size; and a backlight unit comprising the phosphor-containing film as a wavelength converting member.

As a result of extensive studies to achieve the foregoing object, the present inventors have found that the foregoing object can be achieved by taking a configuration in which a phosphor-containing film includes a phosphor-containing layer in which a plurality of fluorescent regions, each of which contains a phosphor that deteriorates through a reaction with oxygen in the case of being exposed to oxygen, are discretely arranged and a resin layer having impermeability to oxygen is arranged among the plurality of discretely arranged fluorescent regions; and a first substrate film laminated on one main surface of the phosphor-containing layer and a second substrate film laminated on the other main surface of the phosphor-containing layer, in which the resin layer has a Knoop hardness of 115 N/mm$^2$ to 285 N/mm$^2$, a creep recovery rate of 22% or less, and an elastic recovery rate of 60% or more. The present invention has been completed based on these findings.

That is, it has been found that the foregoing object can be achieved by the following configuration.

(1) A phosphor-containing film comprising:
  a phosphor-containing layer in which a plurality of fluorescent regions, each of which contains a phosphor that deteriorates through a reaction with oxygen in the case of being exposed to oxygen, are discretely arranged and a resin layer having impermeability to oxygen is arranged among the plurality of discretely arranged fluorescent regions; and
  a first substrate film laminated on one main surface of the phosphor-containing layer and a second substrate film laminated on the other main surface of the phosphor-containing layer,
  in which the resin layer has a Knoop hardness of 115 N/mm$^2$ to 285 N/mm$^2$, a creep recovery rate of 22% or less, and an elastic recovery rate of 60% or more.

(2) The phosphor-containing film according to (1), in which the region losing the fluorescence properties and the resin layer are exposed on the end face of the phosphor-containing film.

(3) The phosphor-containing film according to (1) or (2), in which the resin layer has an oxygen permeability of 10 cc/(m$^2$·day·atm) or less.

(4) The phosphor-containing film according to any one of (1) to (3), in which the oxygen permeability of the first substrate film and the second substrate film is 1 cc/(m$^2$·day·atm) or less.

(5) The phosphor-containing film according to any one of (1) to (4), in which a resin contained in the resin layer is formed of a composition containing a compound having a photopolymerizable functional group or a thermopolymerizable functional group.

(6) A backlight unit comprising:
  a wavelength converting member including the phosphor-containing film according to any one of (1) to (5), and
  at least one of a blue light emitting diode or an ultraviolet light emitting diode.

According to the present invention, it is possible to provide a phosphor-containing film which contains a phosphor such as a quantum dot and is capable of suppressing the deterioration of the phosphor even in the case where the film is formed into a laminated structure, which is then cut into a desired size; and a backlight unit comprising the phosphor-containing film as a wavelength converting member.

DESCRIPTION OF THE PREFERRED EMBODIMENTS

Figure 1:
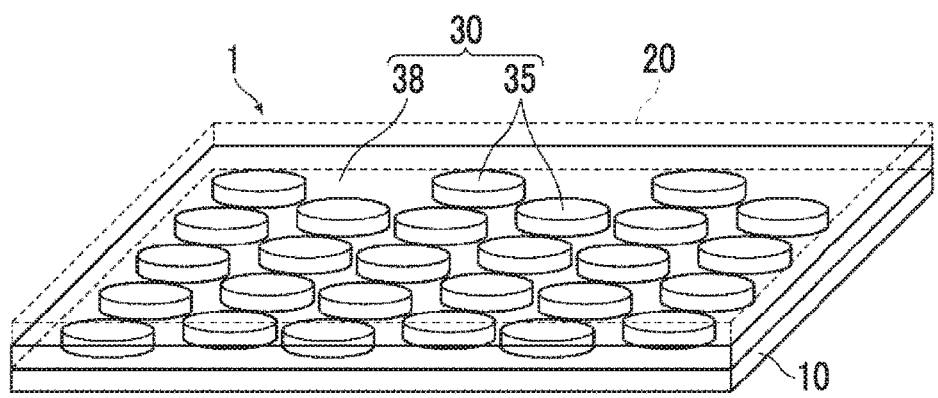
FIG. 1 is a perspective view schematically showing an example of a phosphor-containing film of the present invention.

Hereinafter, embodiments of a phosphor-containing film and a backlight unit comprising the phosphor-containing film according to the present invention will be described with reference to the accompanying drawings. In the drawings of the present specification, the scale of each part is appropriately changed for easy visual recognition. In the present specification, the numerical range expressed by using "to" means a range including numerical values described before and after "to" as a lower limit value and an upper limit value, respectively.

<Phosphor-Containing Film>

The phosphor-containing film according to the embodiment of the present invention is a phosphor-containing film including:

a phosphor-containing layer in which a plurality of fluorescent regions, each of which contains a phosphor that deteriorates through a reaction with oxygen in the case of being exposed to oxygen, are discretely arranged and a resin layer having impermeability to oxygen is arranged among the plurality of discretely arranged fluorescent regions; and a first substrate film laminated on one main surface of the phosphor-containing layer and a second substrate film laminated on the other main surface of the phosphor-containing layer, in which the resin layer has a Knoop hardness of 115 N/mm$^2$ to 285 N/mm$^2$, a creep recovery rate of 22% or less, and an elastic recovery rate of 60% or more.

Figure 2:
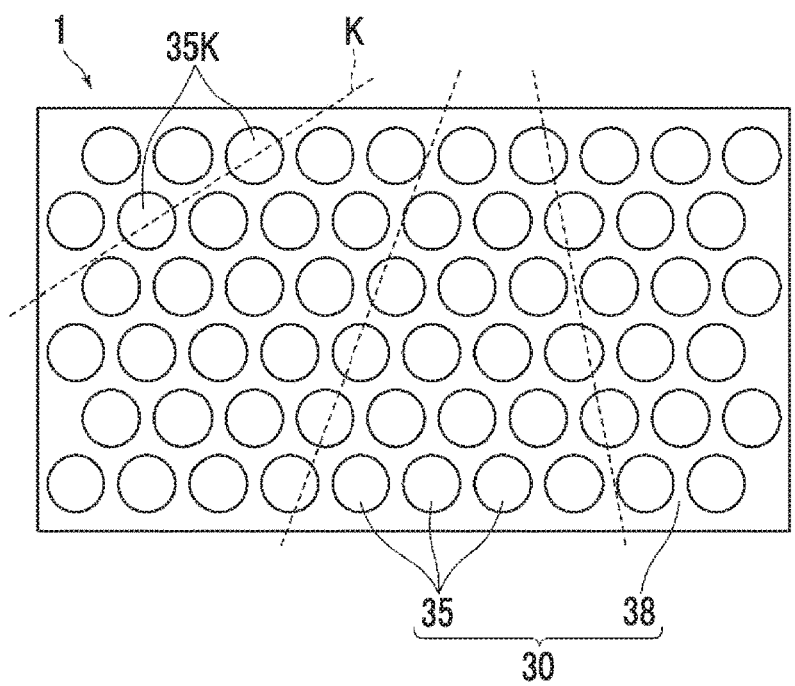
FIG. 2 is a plan view of the phosphor-containing film of FIG. 1.
Figure 3:
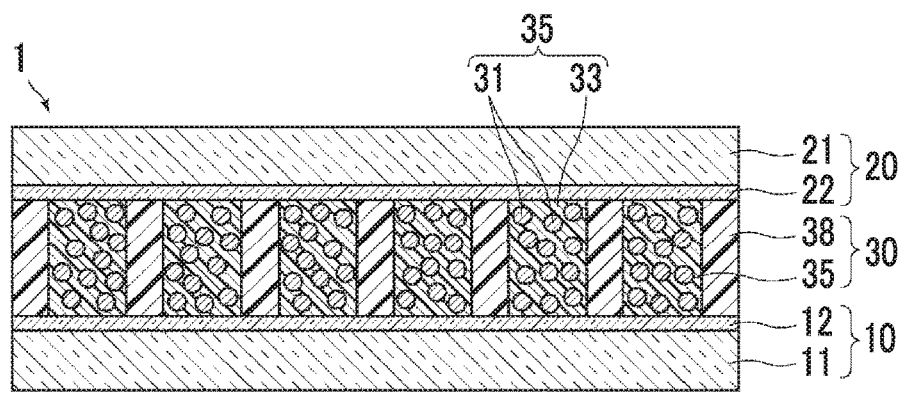
FIG. 3 is a cross-sectional view of the phosphor-containing film of FIG. 1.

FIG. 1 is a perspective view schematically showing an example of a phosphor-containing film 1 according to the embodiment of the present invention, FIG. 2 is a plan view of FIG. 1, and FIG. 3 is a cross-sectional view of FIG. 1. In FIG. 1, a second substrate film 20 is indicated by a broken line and a phosphor-containing layer 30 is indicated by a solid line for the purpose of explanation.

The phosphor-containing film 1 of the present embodiment comprises a first substrate film 10, a phosphor-containing layer 30 in which a plurality of regions 35 containing phosphors 31 which deteriorates by being reacted with oxygen upon exposure to oxygen are discretely arranged on the first substrate film 10, and a resin layer 38 having impermeability to oxygen is disposed between the discretely arranged regions 35 containing phosphors 31, and a second substrate film 20 disposed on the phosphor-containing layer 30. Hereinafter, the region 35 containing the phosphors 31 may be referred to as a fluorescent region 35 in some cases.

In the present specification, the phrase "a plurality of regions containing phosphors . . . are discretely arranged on the first substrate film" means that, as shown in FIGS. 1 and 2, in the case of being viewed from the direction perpendicular to the film surface of the first substrate film (in plan view), a plurality of fluorescent regions 35 are disposed in isolation without contacting each other in the two-dimensional direction along the film surface of the first substrate film 10. In the present example, the fluorescent regions 35 are in the form of a cylinder (disk), and each fluorescent region 35 is isolatedly surrounded by a resin layer 38 having impermeability to oxygen in the two-dimensional direction along the film surface of the first substrate film 10, and the penetration of oxygen from the two-dimensional direction along the film surface of the first substrate film 10 into the individual fluorescent regions 35 is blocked.

In the present specification, the phrase, "having impermeability to oxygen" means that an oxygen permeability is 10 cc/(m$^2$·day·atm) or less. The oxygen permeability of the resin layer having impermeability to oxygen is more preferably 1 cc/(m$^2$·day·atm) or less and still more preferably 10$^{-1}$ cc/(m$^2$·day·atm) or less. The phrase "having impermeability" and the phrase "having barrier properties" in the present specification are used synonymously. That is, in the present specification, a gas barrier means having impermeability to a gas, and a water vapor barrier means having impermeability to water vapor. Further, a layer having impermeability to both of oxygen and water vapor is referred to as a "barrier layer".

In the phosphor-containing film 1 according to the embodiment of the present invention, since the fluorescent regions 35 are discretely arranged in the two-dimensional direction, as shown in FIG. 2, assuming that the phosphor-containing film 1 is a part of a long film, whichever portion is linearly cut as indicated by the broken line, the fluorescent region 35 other than the fluorescent region 35 which is the cut point is surrounded by the resin layer 38, and thus can be kept in a sealed state. In addition, the fluorescent region 35 that has been cut and exposed to outside air loses its function as an original phosphor, but the region losing the fluorescence properties becomes a resin layer that protects the fluorescent region 35 not exposed to outside air from the outside air.

Here, in the phosphor-containing film according to the embodiment of the present invention, the resin layer has a Knoop hardness of 115 N/mm$^2$ to 285 N/mm$^2$, a creep recovery rate of 22% or less, and an elastic recovery rate of 60% or more.

As described above, in order to produce a phosphor-containing film containing a phosphor such as a quantum dot with high production efficiency, preferred is a method in which a coating step and a curing step are sequentially carried out on a long film by a roll-to-roll method to form a laminated structure which is then cut into a desired size. In the case where a phosphor-containing film of a desired size is cut from this long film, the phosphor-containing layer is exposed to the outside air at the cut end face, so it is necessary to take measures against the penetration of oxygen from the cut end face.

Therefore, by taking a configuration in which phosphors such as quantum dots are discretely arranged in a plurality of regions and a sealing material is arranged around the phosphors, it is considered to keep the sealed state of the fluorescent member even in the case where the optical component is cut, by cutting the film at the part of the sealing material at the time of cutting the phosphor-containing film.

However, even in the case of a configuration such that the phosphors are discretely arranged and sealed with a sealing material, it was found that there is a problem that cracks are generated in the sealing material and therefore moisture and oxygen are likely to penetrate, at the time of cutting the phosphor-containing film.

In contrast, the phosphor-containing film according to the embodiment of the present invention is configured such that the resin layer, which is a sealing material, has a Knoop hardness of 115 N/mm$^2$ to 285 N/mm$^2$, a creep recovery rate of 22% or less, and an elastic recovery rate of 60% or more, so that cracking of the resin layer (sealing material) at the time of cutting the phosphor-containing film can be suppressed, and penetration of moisture and oxygen from the end face in the phosphor-containing film after cutting thereof can be suppressed, resulting in suppression of deterioration of the phosphor.

More specifically, the resin layer exhibiting a Knoop hardness of 115 N/mm² to 285 N/mm² on at least one surface and preferably on both surfaces thereof can exhibit good results in cutting. The indentation of a Knoop indenter in the case of measuring the Knoop hardness can mainly simulate the penetration of a cutting blade. Therefore, in the case where the Knoop hardness is too small, micro scratches also occur in a direction different from the direction in which cutting is desired, thus causing cracks, and in the case where the Knoop hardness is too large, it is considered that the load by the cutting blade is insufficient and therefore the cut remainder appears.

From the viewpoint of further improving the cutting ability, the Knoop hardness is preferably 140 N/mm² to 285 N/mm².

The Knoop hardness in the present invention is a value obtained by the following method.

Using a PICODENTOR HM500p type hardness tester manufactured by Fischer Instruments K.K., the surface of a sample fixed to a glass substrate is measured with a Knoop indenter under the conditions of a load time of 10 sec, a creep time under a maximum load of 5 sec, an unloading time of 10 sec, a creep time after unloading of 5 sec, and a maximum load of 20 mN. The hardness is calculated from the relationship between the indenter-sample contact area obtained from the indentation depth and the maximum load, and the average value of values at 10 points is taken as the Knoop hardness.

The resin layer exhibiting a creep recovery rate of 22% or less on at least one surface and preferably on both surfaces thereof can exhibit good results in cutting. The creep recovery rate represents the recovery rate of the indentation depth after unloading following the indentation of the Knoop indenter, which corresponds to a deformation amount obtained by subtracting the "elastic recovery portion" and the "plastic (permanent) deformation portion in which the bond is broken" from the maximum indentation depth, and corresponds to the viscoelastic deformation. In the case where the viscoelastic deformation is large, a part of the work given by indentation is wastefully consumed, and even in the case where the same force is given, plastic (permanent) deformation does not proceed as compared with the case where viscoelastic deformation is small. Therefore, it is considered that, in the case where the creep recovery rate is too high, the viscoelastic behavior will appear and consequently the cut remainder appears.

From the viewpoint of further improving the cutting ability, the creep recovery rate is preferably 20% or less.

The creep recovery rate in the present invention is a value obtained by the following method.

Using a PICODENTOR HM500p type hardness tester manufactured by Fischer Instruments K.K., the surface of a sample fixed to a glass substrate is measured with a Knoop indenter under the conditions of a load time of 10 sec, a creep time under a maximum load of 5 sec, an unloading time of 10 sec, a creep time after unloading of 5 sec, and a maximum load of 20 mN. The ratio of creep recovery is calculated from the relationship between the indentation depth immediately after unloading and the depth after 5 seconds of unloading, and the average value of values at 10 points is taken as the creep recovery rate.

The resin layer exhibiting an elastic recovery rate of 60% or more on at least one surface and preferably on both surfaces thereof can exhibit good results in cutting. The elastic recovery rate represents a deformation recovery rate until the load becomes zero from the maximum load of the Knoop indenter. Unlike creep recovery, the elastic recovery rate corresponds to an amount of deformation recovery instantaneously immediately after unloading. In the case where the elastic recovery rate is small against creep recovery, recovery of deformation due to indentation is delayed. Therefore, in the case where the elastic recovery rate is too small, shape recovery after cutting is delayed, resulting in film thickness unevenness, which is considered to lead to luminance unevenness.

From the viewpoint of further improving the cutting ability, the elastic recovery rate is preferably 65% or more.

The elastic recovery rate in the present invention is a value obtained by the following method.

Using a PICODENTOR HM500p type hardness tester manufactured by Fischer Instruments K.K., the surface of a sample fixed to a glass substrate is measured with a Knoop indenter under the conditions of a load time of 10 sec, a creep time under a maximum load of 5 sec, an unloading time of 10 sec, a creep time after unloading of 5 sec, and a maximum load of 20 mN. The ratio of elastic recovery is calculated from the relationship between the area surrounded by three points of [indentation depth after creep time, maximum load], [indentation depth after creep time, zero load], and [indentation depth immediately after unloading, zero load] (corresponding to elastic deformation energy E released at unloading), and the area surrounded by four points of the origin, [indentation depth before creep time, maximum load], [indentation depth after creep time, maximum load], and [indentation depth after creep time, zero load] (corresponding to the total energy E required for load (and creep)), on the graph obtained by plotting the horizontal axis as an indentation depth and the vertical axis as a load, and the average value of values at 10 points is taken as the elastic recovery rate.

Here, in particular, in the case where cutting is carried out across the resin layer and the fluorescent region, there are cases where cracks are likely to occur in the resin layer due to a difference in hardness between the resin layer and the fluorescent region or the like. However, cracking of the resin layer at the time of cutting can be suitably suppressed by setting the Knoop hardness, the creep recovery rate, and the elastic recovery rate of the resin layer to the above ranges.

Further, in the phosphor-containing film according to the embodiment of the present invention, cracking of the resin layer can be suitably suppressed even in the case where cutting is carried out across the resin layer and the fluorescent region, so that the cut point can be freely selected, and the degree of freedom in the size and shape at the time of cutting is high.

In addition, in the case where cutting is carried out across the resin layer and the fluorescent region, the phosphor-containing film has a configuration in which the region losing the fluorescence properties and the resin layer are exposed at the end face which is the cut surface. In addition, in the case where the fluorescent region is cut across a plurality of regions, the phosphor-containing film has a configuration in which the region losing the fluorescence properties and the resin layer are alternately exposed at the end face of the phosphor-containing film.

Here, the fluorescent region 35 is formed by dispersing the phosphors 31 in a binder 33. In the case where the oxygen permeability of the binder 33 is larger than the permeability of the resin layer 38 filled between the fluorescent regions 35, that is, in the case where the binder 33 tends to permeate oxygen, the effects of the present invention are particularly remarkable.

Further, the first substrate film 10 and the second substrate film 20 are preferably impermeable to oxygen and may have a laminated structure of a support film (11, 21) and a barrier layer (12, 22) having impermeability to oxygen as shown in FIG. 3.

In addition, the size and arrangement pattern of the fluorescent region 35 are not particularly limited and may be appropriately designed according to desired conditions. In designing, geometric constraints for arranging the fluorescent regions spaced apart from each other in plan view, allowable values of the width of the non-light emitting region generated at the time of cutting, and the like are taken into consideration. Further, for example, in the case where the printing method is used as one of the methods for forming a fluorescent region to be described later, there is also a restriction that printing cannot be carried out unless the individual occupied area (in plan view) is not less than a certain size. Furthermore, the shortest distance between adjacent fluorescent regions is required to be a distance capable of achieving an oxygen permeability of 10 cc/ $(m^2 \cdot day \cdot atm)$ or less. In consideration of these factors, a desired shape, size, and arrangement pattern may be designed.

Figure 4:
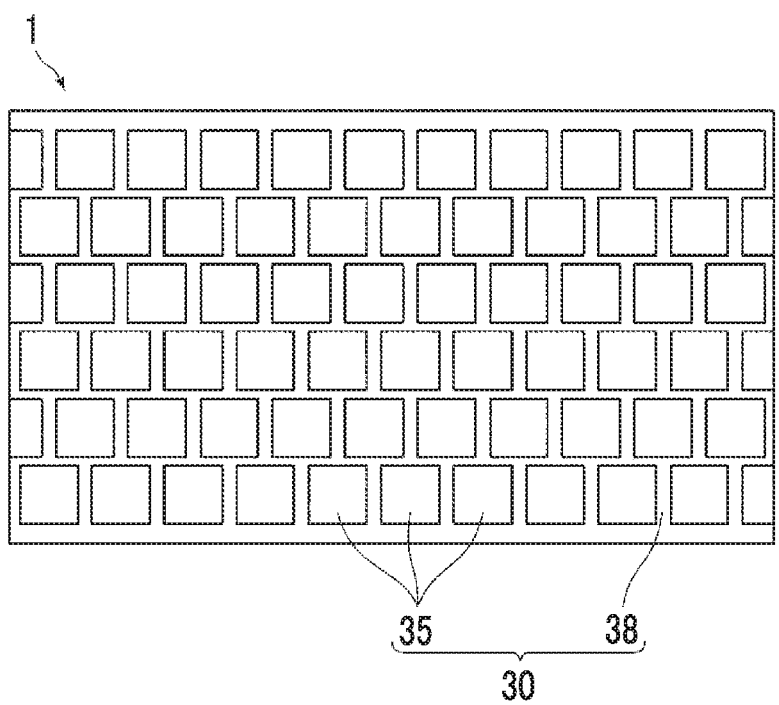
FIG. 4 is a plan view showing another example of a plan view pattern of a fluorescent region.
Figure 5:
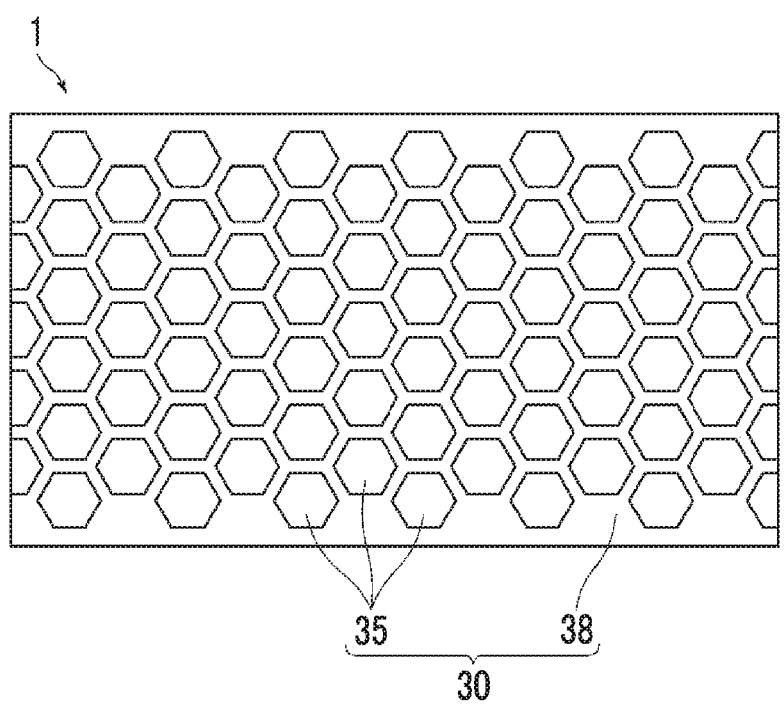
FIG. 5 is a plan view showing still another example of the plan view pattern of the fluorescent region.

In the above embodiment, the fluorescent region 35 is cylindrical and is circular in plan view, but the shape of the fluorescent region 35 is not particularly limited. The fluorescent region 35 may be a polygonal prism such as a quadrangular in plan view as shown in FIG. 4, or a hexagon in plan view as shown in FIG. 5. In the above example, the bottom surface of the cylinder or the polygonal prism is disposed parallel to the substrate film surface, but the bottom surface may not necessarily be disposed parallel to the substrate film surface. Further, the shape of each fluorescent region 35 may be amorphous.

Figure 6:
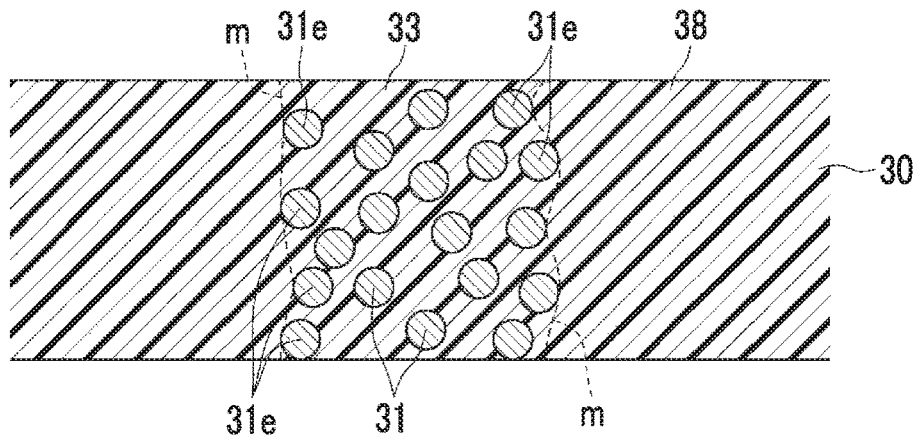
FIG. 6 is a diagram for explaining a method of specifying a contour of the fluorescent region.

In the case where the boundary between the binder 33 in the fluorescent region 35 and the resin layer 38 being impermeable to oxygen and being between the fluorescent regions 35 is not clear, as shown in FIG. 6, a line connecting the points on the outside (the side on which the phosphor 31 is not disposed) of the phosphor 31e positioned at the outermost position of the region where the phosphor 31 is closely disposed is considered as the contour m of the fluorescent region 35 (the boundary between the fluorescent region 35 and the resin layer 38). The position of the phosphor can be specified by irradiation of the phosphor-containing layer with excitation light to cause the phosphor to emit light, followed by observation with, for example, a confocal laser microscope or the like, whereby the contour m of the fluorescent region 35 can be specified. In the present specification, the side of a cylinder or a polygonal prism is allowed to meander like the contour in FIG. 6.

In the above embodiment, the fluorescent region 35 is periodically disposed in a pattern, but it may be non-periodic as long as the desired performance is not impaired in the case where a plurality of fluorescent regions 35 are discretely arranged. It is preferable that the fluorescent region 35 is uniformly distributed over the entire region of the phosphor-containing layer 30 because the in-plane distribution of luminance is uniform.

In order to obtain a sufficient amount of fluorescence, it is desirable to make the region occupied by the fluorescent region 35 as large as possible.

The phosphor 31 in the fluorescent region 35 may be of one kind or of plural kinds. In addition, the phosphor 31 in one fluorescent region 35 is regarded as one kind, and a region containing a first phosphor and a region containing a second phosphor different from the first phosphor among the plurality of fluorescent regions 35 may be disposed periodically or non-periodically. The kind of the phosphor may be three or more.

The phosphor-containing layer 30 may be formed by laminating a plurality of fluorescent regions 35 in the thickness direction of the film. Such an example will be briefly described with reference to FIGS. 7A to 9B. In the following description, the same elements as those of the phosphor-containing film 1 shown in FIG. 1 are denoted by the same reference numerals, and a detailed description thereof will be omitted.

Figure 7A:
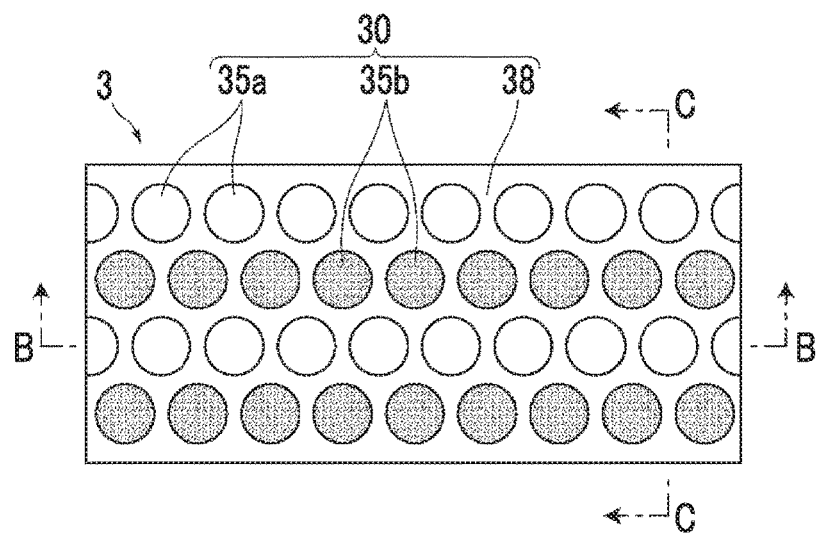
FIG. 7A is a plan view schematically showing another example of the phosphor-containing film of the present invention.
Figure 7B:
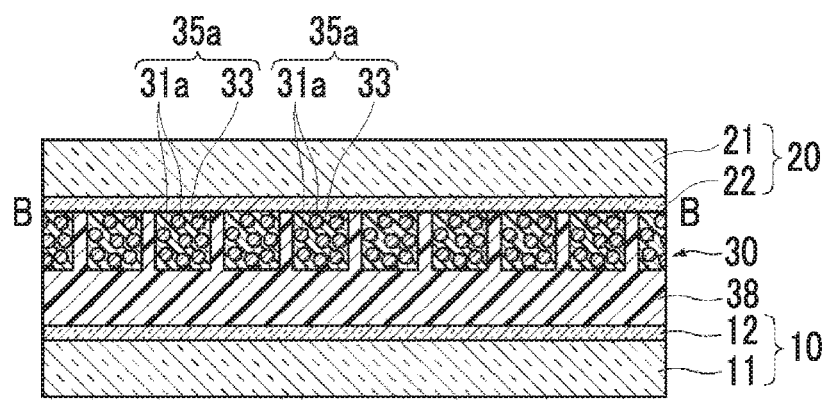
FIG. 7B is a cross-sectional view taken along a line B-B of FIG. 7A.
Figure 7C:
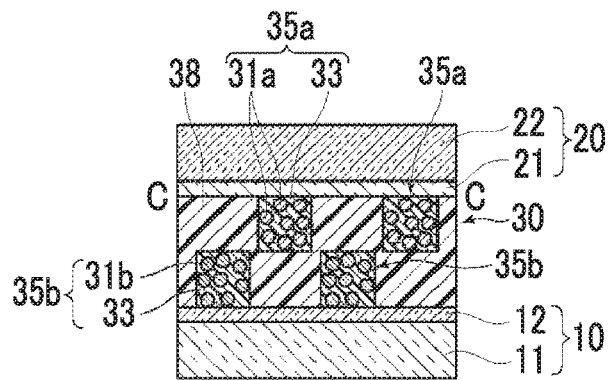
FIG. 7C is a cross-sectional view taken along a line C-C of FIG. 7A.

FIG. 7A is a schematic plan view of another example of the phosphor-containing film, FIG. 7B is a cross-sectional view taken along a line B-B of FIG. 7A, and FIG. 7C is a cross-sectional view taken along a line C-C of FIG. 7A.

The phosphor-containing film 3 shown in FIGS. 7A to 7C comprises, as a fluorescent region, a first fluorescent region 35a in which the first phosphors 31a are dispersed in the binder 33 and a second fluorescent region 35b in which the second phosphors 31b different from the first phosphors 31a are dispersed in the binder 33. The first fluorescent region 35a and the second fluorescent region 35b are alternately disposed in plan view and are dispersedly arranged at different positions in the film thickness direction. The first fluorescent region 35a is disposed on the main surface side adjacent to the second substrate film 20 and the second fluorescent region 35b is disposed on the main surface side adjacent to the first substrate film 10, and the first fluorescent region 35a and the second fluorescent region 35b are disposed so as not to overlap each other in plan view.

The first phosphor 31a and the second phosphor 31b are, for example, phosphors having luminescence center wavelengths different from each other. For example, a phosphor having a luminescence center wavelength in a wavelength range of 600 to 680 nm is used as the first phosphor 31a, and a phosphor having a luminescence center wavelength in a wavelength range of 520 to 560 nm is used as the second phosphor 31b, and so on.

Although the binder 33 of the first fluorescent region 35a and the second fluorescent region 35b is made of the same composition in the present example, it may be made of a different composition.

Figure 8A:
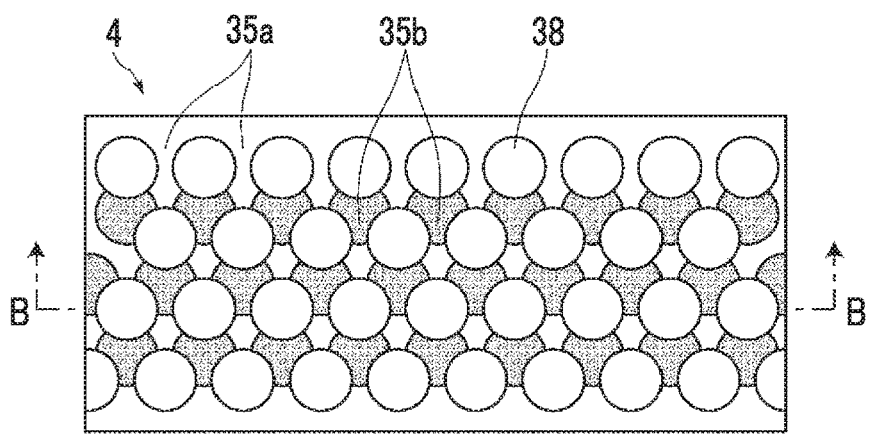
FIG. 8A is a plan view schematically showing still another example of the phosphor-containing film of the present invention.
Figure 8B:
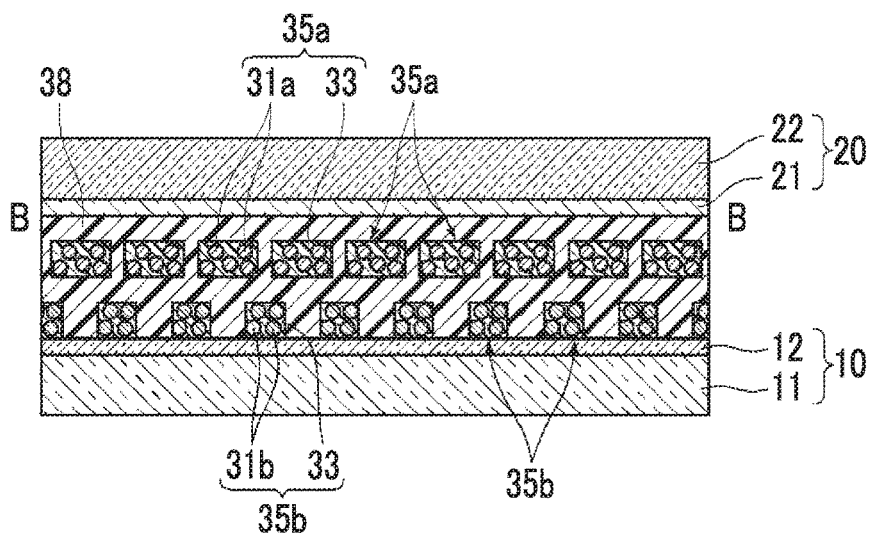
FIG. 8B is a cross-sectional view taken along a line B-B of FIG. 8A.

FIG. 8A is a plan view schematically showing another example of the phosphor-containing film according to the embodiment of the present invention, and FIG. 8B is a cross-sectional view taken along a line B-B of FIG. 8A.

The phosphor-containing film 4 shown in FIGS. 8A and 8B is different from the phosphor-containing film 3 shown in FIGS. 7A to 7C in that the first fluorescent region 35a and the second fluorescent region 35b disposed at different positions in the film thickness direction partially overlap each other in the case where the film surface is viewed in plan view. In this manner, the first fluorescent region 35a and the second fluorescent region 35b disposed at different positions in the film direction may overlap each other in plan view.

Figure 9A:
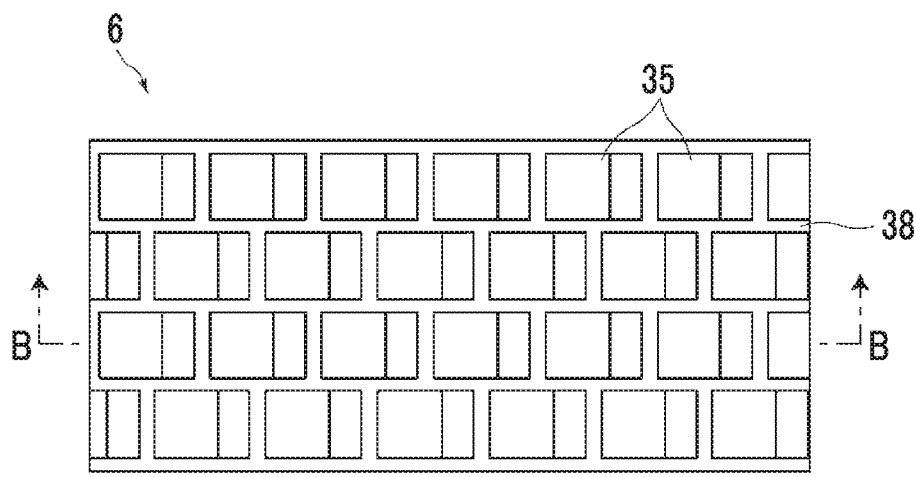
FIG. 9A is a plan view schematically showing still another example of the phosphor-containing film of the present invention.
Figure 9B:
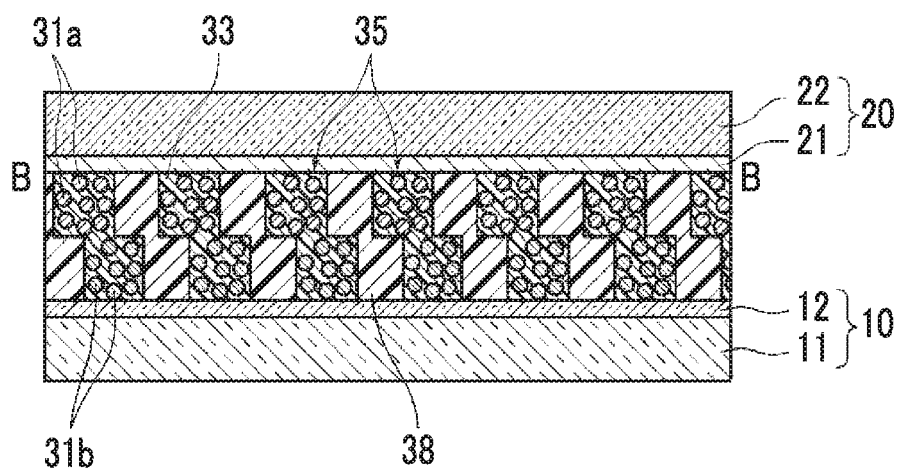
FIG. 9B is a cross-sectional view taken along a line B-B of FIG. 9A.
Figure 10:
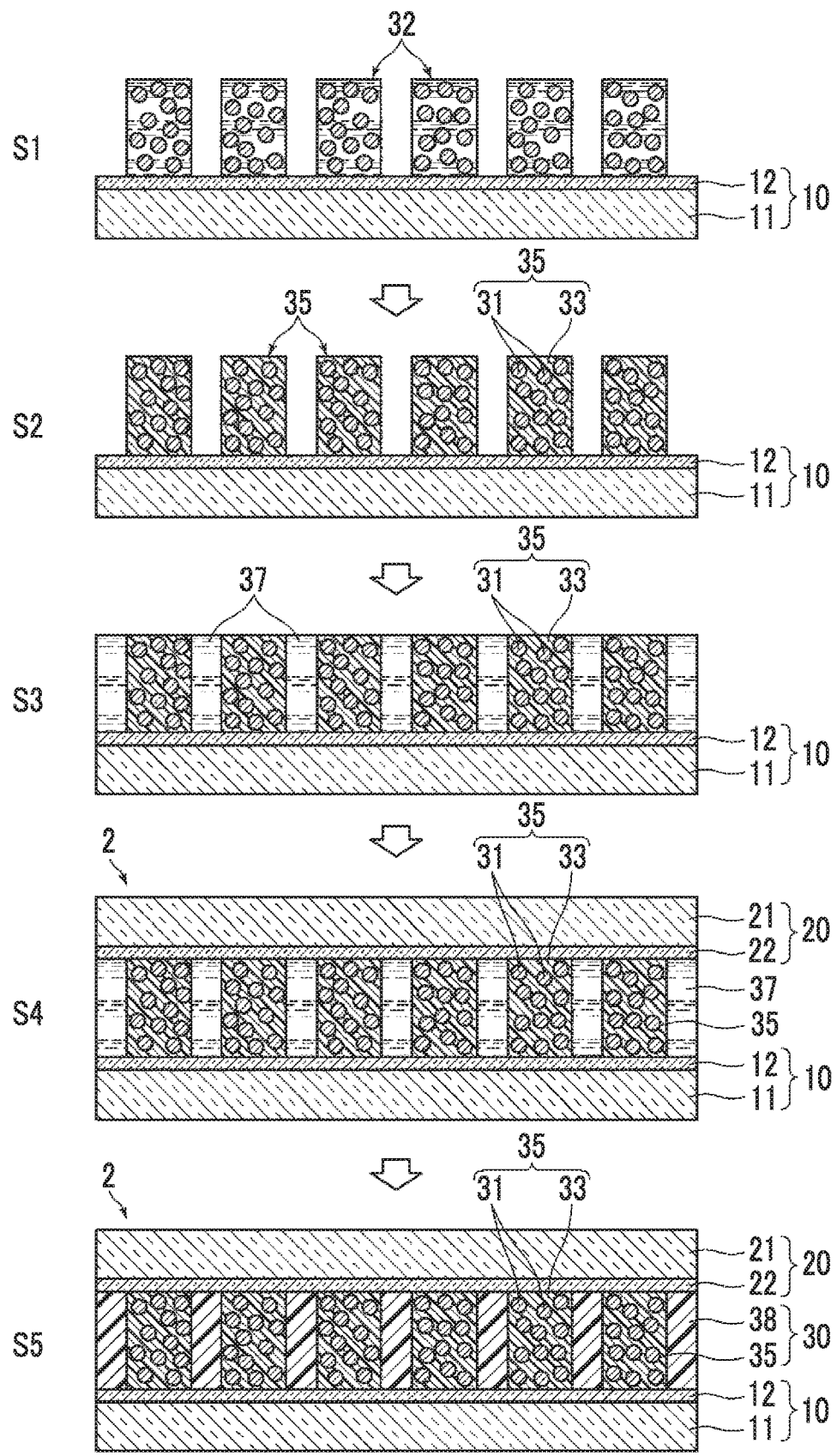
FIG. 10 is a view showing a production step of the phosphor-containing film.

FIG. 9A is a plan view schematically showing another example of the phosphor-containing film according to the embodiment of the present invention, and FIG. 9B is a cross-sectional view taken along a line B-B of FIG. 9A.

The phosphor-containing film 6 shown in FIGS. 9A and 9B comprises a step-like fluorescent region 35 in which quadrangular prism-shaped regions are laminated with a shift of a half cycle. In the fluorescent region 35, the first phosphors 31a and the second phosphors 31b are dispersed in the binder 33. In the present example, the second phosphors 31b are dispersed in the lower step portion of the step-like fluorescent region 35 and the first phosphors 31a are dispersed in the upper step portion of the step-like fluorescent region 35, but the first phosphors 31a and the second phosphors 31b may be mixed in the entire upper and lower step portions in the fluorescent region 35.

As described above, in the phosphor-containing film according to the embodiment of the present invention, the shape of the fluorescent region 35 and the arrangement pattern thereof are not particularly limited. The fluorescent regions are discretely arranged on the film surface in any case, so that the phosphor in the fluorescent region at the cut end portion deteriorates but the fluorescent region in the portion other than the cut end portion is scaled by being surrounded with an oxygen-impermeable resin in the direction along the film surface. Consequently, it is possible to suppress deterioration in performance due to the penetration of oxygen from the direction along the film surface.

Hereinafter, individual constituent elements of the phosphor-containing film according to the embodiment of the present invention will be described.

The phosphor-containing film 1 takes a configuration in which the phosphor-containing layer 30 is laminated on one film surface of the first substrate film 10, the second substrate film 20 is laminated on the phosphor-containing layer 30, and the phosphor-containing layer 30 is sandwiched between two substrate films 10 and 20.

—Phosphor-Containing Layer—

The phosphor-containing layer 30 comprises a fluorescent region 35 containing a plurality of phosphors 31 and a resin layer 38 impermeable to oxygen and filled between the fluorescent regions 35.

<<Region Containing Phosphors (Fluorescent Region)>>

The fluorescent region 35 is constituted of phosphors 31 and a binder 33 in which the phosphors 31 are dispersed and is formed by applying and curing a coating liquid for forming a fluorescent region containing the phosphors 31 and a curable compound.

<Phosphor>

Various known phosphors can be used as a phosphor which deteriorates by being reacted with oxygen upon exposure to oxygen. Examples of the phosphor include inorganic phosphors such as rare earth doped garnet, silicates, aluminates, phosphates, ceramic phosphors, sulfide phosphors, and nitride phosphors, and organic fluorescent substances including organic fluorescent dyes and organic fluorescent pigments. In addition, phosphors with rare earth-doped semiconductor fine particles, and semiconductor nanoparticles (quantum dots and quantum rods) are also preferably used. A single kind of phosphor may be used alone, but a plurality of phosphors having different wavelengths may be mixed and used so as to obtain a desired fluorescence spectrum, or a combination of phosphors of different material constitutions (for example, a combination of a rare earth doped garnet and quantum dots) may be used.

As used herein, the phrase "exposure to oxygen" means exposure to an environment containing oxygen, such as in the atmosphere, and the phrase "deteriorates by being reacted with oxygen" means that the phosphor is oxidized so that the performance of the phosphor deteriorates (decreases) and refers to mainly the luminescence performance declining as compared with that before the reaction with oxygen, and in the case where the phosphor is used as a photoelectric conversion element, such a phrase means that the photoelectric conversion efficiency declines as compared with that before the reaction with oxygen.

In the following description, as a phosphor deteriorating by oxygen, mainly quantum dots will be described as an example. However, the phosphor of the present invention is not limited to quantum dots and is not particularly limited as long as it is a fluorescent coloring agent that deteriorates due to oxygen, or a material that converts energy from the outside into light or converts light into electricity, such as a photoelectric conversion material.

(Quantum Dot)

The quantum dot is a fine particle of a compound semiconductor having a size of several nm to several tens of nm and is at least excited by incident excitation light to emit fluorescence.

The phosphor of the present embodiment may include at least one quantum dot or may include two or more quantum dots having different luminescence properties. Known quantum dots include a quantum dot (A) having a luminescence center wavelength in a wavelength range of 600 nm or more and 680 nm or less, a quantum dot (B) having a luminescence center wavelength in a wavelength range of 500 nm or more to less than 600 nm, and a quantum dot (C) having a luminescence center wavelength in a wavelength range of 400 nm or more to less than 500 nm, and the quantum dot (A) is excited by excitation light to emit red light, the quantum dot (B) is excited by excitation light to emit green light, and the quantum dot (C) is excited by excitation light to emit blue light. For example, in the case where blue light is incident as excitation light to a phosphor-containing layer containing the quantum dot (A) and the quantum dot (B), red light emitted from the quantum dot (A), green light emitted from the quantum dot (B) and blue light permeating through the phosphor-containing layer can realize white light. Alternatively, ultraviolet light can be incident as excitation light to a phosphor-containing layer containing the quantum dots (A), (B), and (C), thereby allowing red light emitted from the quantum dot (A), green light emitted from the quantum dot (B), and blue light emitted from the quantum dot (C) to realize white light.

With respect to the quantum dot, reference can be made to, for example, paragraphs [0060] to [0066] of JP2012-169271A, but the quantum dot is not limited to those described therein. As the quantum dot, commercially available products can be used without any limitation. The luminescence wavelength of the quantum dot can usually be adjusted by the composition and size of the particles.

The quantum dot can be added in an amount of, for example, about 0.1 to 10 parts by mass with respect to 100 parts by mass of the total amount of the coating liquid.

The quantum dots may be added into the coating liquid in the form of particles or in the form of a dispersion liquid in which the quantum dots are dispersed in an organic solvent. It is preferable that the quantum dots be added in the form of a dispersion liquid, from the viewpoint of suppressing aggregation of quantum dot particles. The organic solvent used for dispersing the quantum dots is not particularly limited.

As the quantum dots, for example, core-shell type semiconductor nanoparticles are preferable from the viewpoint of improving durability. As the core, Group II-VI semiconductor nanoparticles, Group II-V semiconductor nanoparticles, multi-component semiconductor nanoparticles, and the like can be used. Specific examples thereof include, but are not limited to, CdSe, CdTe, CdS, ZnS, ZnSe, ZnTe, InP, InAs, and InGaP. Among them, CdSe, CdTe, InP, InGaP are preferable from the viewpoint of emitting visible light with high efficiency. As the shell, CdS, ZnS, ZnO, GaAs, and complexes thereof can be used, but it is not limited thereto.

The luminescence wavelength of the quantum dot can usually be adjusted by the composition and size of the particles.

The quantum dot may be a spherical particle or may be a rod-like particle also called a quantum rod, or may be a tetrapod-type particle. A spherical quantum dot or rod-like quantum dot (that is, a quantum rod) is preferable from the viewpoint of narrowing a full width at half maximum (FWHM) and enlarging the color reproduction range of a liquid crystal display.

A ligand having a Lewis basic coordinating group may be coordinated on the surface of the quantum dot. It is also possible to use quantum dots in which such a ligand is already coordinated. Examples of the Lewis basic coordinating group include an amino group, a carboxy group, a mercapto group, a phosphine group, and a phosphine oxide group. Specific examples thereof include hexylamine, decylamine, hexadecylamine, octadecylamine, oleylamine, myristylamine, laurylamine, oleic acid, mercaptopropionic acid, trioctylphosphine, and trioctylphosphine oxide. Among these, hexadecylamine, trioctylphosphine, and trioctylphosphine oxide are preferable, and trioctylphosphine oxide is particularly preferable.

Quantum dots in which these ligands are coordinated can be produced by a known synthesis method. For example, such quantum dots can be synthesized by the method described in C. B. Murray, D. J. Norris, M. G. Bawendi, Journal American Chemical Society, 1993, 115(19), pp. 8706 to 8715, or The Journal Physical Chemistry, 101, pp. 9463 to 9475, 1997. In addition, commercially available quantum dots in which the ligands are coordinated can be used without any limitation. For example, Lumidot (manufactured by Sigma-Aldrich Co. LLC.) can be mentioned.

In the present invention, the content of the ligand-coordinated quantum dots is preferably 0.01% to 10% by mass and more preferably 0.05% to 5% by mass with respect to the total mass of the polymerizable compound contained in the quantum dot-containing composition to be the fluorescent region. It is desirable to adjust the concentration, depending on the thickness of the phosphor-containing film.

The quantum dots may be added to the quantum dot-containing composition in the form of particles or in the form of a dispersion liquid dispersed in a solvent. It is preferable to add the quantum dots in the form of a dispersion liquid from the viewpoint of suppressing aggregation of particles of quantum dots. The solvent used here is not particularly limited.

(Method for Synthesizing Ligand)

The ligand in the quantum dot-containing composition can be synthesized by a known synthesis method. For example, the ligand can be synthesized by the method described in JP2007-277514A.

(Binder Curable Compound in Fluorescent Region)

A compound having a polymerizable group can be widely adopted as the curable compound. The type of the polymerizable group is not particularly limited and is preferably a compound having a photopolymerizable or thermopolymerizable functional group. Further, the polymerizable group is preferably a (meth)acrylate group, a vinyl group, or an epoxy group, more preferably a (meth)acrylate group, and still more preferably an acrylate group. With respect to a polymerizable monomer having two or more polymerizable groups, the respective polymerizable groups may be the same or different.

—(Meth)Acrylate-Based Compounds—

From the viewpoint of transparency, adhesiveness, or the like of a cured film after curing, a (meth)acrylate compound such as a monofunctional or polyfunctional (meth)acrylate monomer, a polymer or prepolymer thereof, or the like is preferable. In the present invention and the present specification, the term "(meth)acrylate" is used to mean at least one or any one of acrylate or methacrylate. The same applies to the term "(meth)acryloyl" and the like.

—Monofunctional Ones—

A monofunctional (meth)acrylate monomer may be, for example, acrylic acid or methacrylic acid, or derivatives thereof, more specifically, a monomer having one polymerizable unsaturated bond ((meth)acryloyl group) of (meth)acrylic acid in the molecule. Specific examples thereof include the following compounds, but the present embodiment is not limited thereto.

Examples thereof include alkyl (meth)acrylates having 1 to 30 carbon atoms in the alkyl group, such as methyl (meth)acrylate, n-butyl (meth)acrylate, isobutyl (meth)acrylate, 2-ethylhexyl (meth)acrylate, isononyl (meth)acrylate, n-octyl (meth)acrylate, lauryl (meth)acrylate, and stearyl (meth)acrylate; aralkyl (meth)acrylates having 7 to 20 carbon atoms in the aralkyl group, such as benzyl (meth)acrylate; alkoxyalkyl (meth)acrylates having 2 to 30 carbon atoms in the alkoxyalkyl group, such as butoxyethyl (meth)acrylate; aminoalkyl (meth)acrylates having 1 to 20 carbon atoms in total in the (monoalkyl or dialkyl)aminoalkyl group, such as N,N-dimethylaminoethyl (meth)acrylate; polyalkylene glycol alkyl ether (meth)acrylates having 1 to 10 carbon atoms in the alkylene chain and having 1 to 10 carbon atoms in the terminal alkyl ether, such as diethylene glycol ethyl ether (meth)acrylate, triethylene glycol butyl ether (meth)acrylate, tetraethylene glycol monomethyl ether (meth)acrylate, hexaethylene glycol monomethyl ether (meth)acrylate, octaethylene glycol monomethyl ether (meth)acrylate, nonaethylene glycol monomethyl ether (meth)acrylate, dipropylene glycol monomethyl ether (meth)acrylate, heptapropylene glycol monomethyl ether (meth)acrylate, and tetraethylene glycol monoethyl ether (meth)acrylate; polyalkylene glycol aryl ether (meth)acrylates having 1 to 30 carbon atoms in the alkylene chain and having 6 to 20 carbon atoms in the terminal aryl ether, such as hexaethylene glycol phenyl ether (meth)acrylate; (meth)acrylates having an alicyclic structure and having 4 to 30 carbon atoms in total, such as cyclohexyl (meth)acrylate, dicyclopentanyl (meth)acrylate, isobornyl (meth)acrylate, and methylene oxide addition cyclodecatriene (meth)acrylate; fluorinated alkyl (meth)acrylates having 4 to 30 carbon atoms in total, such as heptadecafluorodecyl (meth)acrylate; (meth)acrylates having a hydroxyl group, such as 2-hydroxyethyl (meth)acrylate, 3-hydroxypropyl (meth)acrylate, 4-hydroxybutyl (meth)acrylate, triethylene glycol mono (meth)acrylate, tetraethylene glycol mono(meth)acrylate, hexaethylene glycol mono(meth)acrylate, octapropylene glycol mono(meth)acrylate, and glycerol mono or di(meth)acrylate; (meth)acrylates having a glycidyl group, such as glycidyl (meth)acrylate; polyethylene glycol mono(meth)acrylates having 1 to 30 carbon atoms in the alkylene chain, such as tetraethylene glycol mono(meth)acrylate, hexaethylene glycol mono(meth)acrylate, and octapropylene glycol mono(meth)acrylate; and (meth)acrylamides such as (meth)acrylamide, N,N-dimethyl (meth)acrylamide, N-isopropyl (meth)acrylamide, 2-hydroxyethyl (meth)acrylamide, and acryloylmorpholine.

The amount of the monofunctional (meth)acrylate monomer to be used is preferably 10 parts by mass or more and more preferably 10 to 80 parts by mass with respect to 100 parts by mass of the total amount of the curable compound contained in the coating liquid, from the viewpoint of adjusting the viscosity of the coating liquid to a preferable range.

—Difunctional Ones—

The polymerizable monomer having two polymerizable groups may be, for example, a difunctional polymerizable unsaturated monomer having two ethylenically unsaturated bond-containing groups. The difunctional polymerizable unsaturated monomer is suitable for allowing a composition to have a low viscosity. In the present embodiment, preferred is a (meth)acrylate-based compound which is excellent in reactivity and which has no problems associated with a remaining catalyst and the like.

In particular, neopentyl glycol di(meth)acrylate, 1,9-nonanediol di(meth)acrylate, dipropylene glycol di(meth)acrylate, tripropylene glycol di(meth)acrylate, tetraethylene glycol di(meth)acrylate, hydroxypivalate neopentyl glycol di(meth)acrylate, polyethylene glycol di(meth)acrylate, dicyclopentenyl(meth)acrylate, dicyclopentenyl oxyethyl (meth)acrylate, dicyclopentanyl di(meth)acrylate, or the like is suitably used in the present invention.

The amount of the difunctional (meth)acrylate monomer to be used is preferably 5 parts by mass or more and more preferably 10 to 80 parts by mass with respect to 100 parts by mass of the total amount of the curable compound contained in the coating liquid, from the viewpoint of adjusting the viscosity of the coating liquid to a preferable range.

—Tri- or Higher Functional Ones—

The polymerizable monomer having three or more polymerizable groups may be, for example, a polyfunctional polymerizable unsaturated monomer having three or more ethylenically unsaturated bond-containing groups. Such a polyfunctional polymerizable unsaturated monomer is excellent in terms of imparting mechanical strength. In the present embodiment, preferred is a (meth)acrylate-based compound which is excellent in reactivity and which has no problems associated with a remaining catalyst and the like.

Specifically, epichlorohydrin (ECH)-modified glycerol tri(meth)acrylate, ethylene oxide (EO)-modified glycerol tri(meth)acrylate, propylene oxide (PO)-modified glycerol tri(meth)acrylate, pentaerythritol triacrylate, pentaerythritol tetraacrylate, EO-modified phosphoric acid triacrylate, trimethylolpropane tri(meth)acrylate, caprolactone-modified trimethylolpropane tri(meth)acrylate, EO-modified trimethylolpropane tri(meth)acrylate, PO-modified trimethylolpropane tri(meth)acrylate, tris(acryloxyethyl)isocyanurate, dipentaerythritol hexa(meth)acrylate, dipentaerythritol penta(meth)acrylate, caprolactone-modified dipentaerythritol hexa(meth)acrylate, dipentaerythritol hydroxypenta(meth)acrylate, alkyl-modified dipentaerythritol penta(meth)acrylate, dipentaerythritol poly(meth)acrylate, alkyl-modified dipentaerythritol tri(meth)acrylate, ditrimethylolpropane tetra(meth)acrylate, pentaerythritolethoxy tetra(meth)acrylate, pentaerythritol tetra(meth)acrylate, or the like is suitable.

Among them, EO-modified glycerol tri(meth)acrylate, PO-modified glycerol tri(meth)acrylate, trimethylolpropane tri(meth)acrylate, EO-modified trimethylolpropane tri(meth)acrylate, PO-modified trimethylolpropane tri(meth)acrylate, dipentaerythritol hexa(meth)acrylate, dipentaerythritol penta(meth)acrylate, pentaerythritolethoxy tetra(meth)acrylate, or pentaerythritol tetra(meth)acrylate is suitably used in the present invention.

The amount of the polyfunctional (meth)acrylate monomer to be used is preferably 5 parts by mass or more from the viewpoint of the coating film hardness of the fluorescent-containing layer after curing, and preferably 95 parts by mass or less from the viewpoint of suppressing gelation of the coating liquid, with respect to 100 parts by mass of the total amount of the curable compound contained in the coating liquid.

From the viewpoint of further improving the heat resistance of the fluorescent region (binder), the (meth)acrylate monomer is preferably an alicyclic acrylate. Examples of such a monofunctional (meth)acrylate monomer include dicyclopentenyl (meth)acrylate, dicyclopentanyl (meth)acrylate, and dicyclopentenyloxyethyl (meth)acrylate. Examples of the difunctional (meth)acrylate monomer include tricyclodecanedimethanol di(meth)acrylate.

The total amount of the polymerizable compound in the curable composition forming a binder is preferably 70 to 99 parts by mass and more preferably 85 to 97 parts by mass with respect to 100 parts by mass of the curable composition, from the viewpoint of handleability and curability of the composition.

—Epoxy-Based Compounds and Others—

The polymerizable monomer used in the present embodiment may be, for example, a compound having a cyclic group such as a ring-opening polymerizable cyclic ether group such as an epoxy group or an oxetanyl group. Such a compound may be more preferably, for example, a compound having a compound (epoxy compound) having an epoxy group. Use of the compound having an epoxy group or an oxetanyl group in combination with the (meth)acrylate-based compound tends to improve adhesiveness to the barrier layer.

Examples of the compound having an epoxy group include polyglycidyl esters of polybasic acids, polyglycidyl ethers of polyhydric alcohols, polyglycidyl ethers of polyoxyalkylene glycols, polyglycidyl esters of aromatic polyols, hydrogenated compounds of polyglycidyl ethers of aromatic polyols, urethane polyepoxy compounds, and epoxidized polybutadienes. These compounds may be used alone or in combination of two or more thereof.

Examples of other compounds having an epoxy group, which may be preferably used, include aliphatic cyclic epoxy compounds, bisphenol A diglycidyl ethers, bisphenol F diglycidyl ethers, bisphenol S diglycidyl ethers, brominated bisphenol A diglycidyl ethers, brominated bisphenol F diglycidyl ethers, brominated bisphenol S diglycidyl ethers, hydrogenated bisphenol A diglycidyl ethers, hydrogenated bisphenol F diglycidyl ethers, hydrogenated bisphenol S diglycidyl ethers, 1,4-butanediol diglycidyl ethers, 1,6-hexanediol diglycidyl ethers, glycerin triglycidyl ethers, trimethylolpropane triglycidyl ethers, polyethylene glycol diglycidyl ethers, and polypropylene glycol diglycidyl ethers; polyglycidyl ethers of polyether polyols, obtained by adding one or two or more alkylene oxides to an aliphatic polyhydric alcohol such as ethylene glycol, propylene glycol, or glycerin; diglycidyl esters of aliphatic long chain dibasic acids; monoglycidyl ethers of aliphatic higher alcohols; monoglycidyl ethers of polyether alcohols, obtained by adding an alkylene oxide to phenol cresol, butyl phenol, or these compounds; and glycidyl esters of higher fatty acids.

Among these components, aliphatic cyclic epoxy compounds, bisphenol A diglycidyl ethers, bisphenol F diglycidyl ethers, hydrogenated bisphenol A diglycidyl ethers, hydrogenated bisphenol F diglycidyl ethers, 1,4-butanediol diglycidyl ethers, 1,6-hexanediol diglycidyl ethers, glycerin triglycidyl ethers, trimethylolpropane triglycidyl ethers, neopentyl glycol diglycidyl ethers, polyethylene glycol diglycidyl ethers, and polypropylene glycol diglycidyl ethers are preferable.

Examples of commercially available products which can be suitably used as the compound having an epoxy group or an oxetanyl group include UVR-6216 (manufactured by Union Carbide Corporation), glycidol, AOEX24, CYCLOMER A200, CELLOXIDE 2021P and CELLOXIDE 8000 (all manufactured by Daicel Corporation), 4-vinylcyclohexene dioxide manufactured by Sigma Aldrich, Inc., EPIKOTE 828, EPIKOTE 812, EPIKOTE 1031, EPIKOTE 872 and EPIKOTE CT508 (all manufactured by Yuka Shell Epoxy K.K.), and KRM-2400, KRM-2410, KRM-2408, KRM-2490, KRM-2720 and KRM-2750 (all manufactured by Asahi Denka Kogyo K.K.). These compounds may be used alone or in combination of two or more thereof.

Although there are no particular restrictions on the production method of such a compound having an epoxy group or an oxetanyl group, the compound can be synthesized with reference to, for example, Literatures such as Fourth Edition Experimental Chemistry Course 20 Organic Synthesis II, p. 213~, 1992, published by Maruzen KK; Ed. by Alfred Hasfner, The chemistry of heterocyclic compounds-Small Ring Heterocycles part 3 Oxiranes, John & Wiley and Sons, An Interscience Publication, New York, 1985, Yoshimura, Adhesion, Vol. 29, No. 12, 32, 1985, Yoshimura, Adhesion, Vol. 30, No. 5, 42, 1986, Yoshimura, Adhesion, Vol. 30, No. 7, 42, 1986, JP1999-100378A (JP-HII-100378A), JP2906245B, and JP2926262B.

A vinyl ether compound may be used as the curable compound used in the present embodiment.

As the vinyl ether compound, a known vinyl ether compound can be appropriately selected, and, for example, the compound described in paragraph [0057] of JP2009-073078A may be preferably adopted.

Such a vinyl ether compound can be synthesized by, for example, the method described in Stephen. C. Lapin, Polymers Paint Colour Journal. 179 (4237), 321 (1988), namely, by a reaction of a polyhydric alcohol or a polyhydric phenol with acetylene, or a reaction of a polyhydric alcohol or a polyhydric phenol with a halogenated alkyl vinyl ether, and such method and reactions may be used alone or in combination of two or more thereof.

For the coating liquid of the present embodiment, a silsesquioxane compound having a reactive group described in JP2009-073078A can also be used from the viewpoint of a decrease in viscosity and an increase in hardness.

Among the foregoing curable compounds, a (meth)acrylate compound is preferable from the viewpoint of composition viscosity and photocurability, and acrylate is more preferable. In the present invention, a polyfunctional polymerizable compound having two or more polymerizable functional groups is preferable. In the present invention, particularly, the compounding ratio of the monofunctional (meth)acrylate compound to the polyfunctional (meth)acrylate compound is preferably 80/20 to 0/100, more preferably 70/30 to 0/100, and still more preferably 40/60 to 0/100 in terms of weight ratio. By selecting an appropriate ratio, it is possible to provide sufficient curability and make the composition low in viscosity.

The ratio of the difunctional (meth)acrylate to the tri- or higher functional (meth)acrylate in the polyfunctional (meth)acrylate compound is preferably 100/0 to 20/80, more preferably 100/0 to 50/50, and still more preferably 100/0 to 70/30 in terms of mass ratio. Since the tri- or higher functional (meth)acrylate has a higher viscosity than the difunctional (meth)acrylate, a larger amount of the difunctional (meth)acrylate is preferable because the viscosity of the curable compound for a resin layer having impermeability to oxygen in the present invention can be lowered.

From the viewpoint of enhancing the impermeability to oxygen, it is preferable to include a compound containing a substituent having an aromatic structure and/or an alicyclic hydrocarbon structure as the polymerizable compound. The polymerizable compound having an aromatic structure and/or an alicyclic hydrocarbon structure is more preferably contained in an amount of 50% by mass or more and still more preferably 80% by mass or more. The polymerizable compound having an aromatic structure is preferably a (meth)acrylate compound having an aromatic structure. As the (meth)acrylate compound having an aromatic structure, a monofunctional (meth)acrylate compound having a naphthalene structure, such as 1- or 2-naphthyl (meth)acrylate, 1- or 2-naphthylmethyl (meth)acrylate, or 1- or 2-naphthylethyl (meth)acrylate, a monofunctional acrylate having a substituent on the aromatic ring, such as benzyl acrylate, and a difunctional acrylate such as catechol diacrylate or xylylene glycol diacrylate are particularly preferable. As the polymerizable compound having an alicyclic hydrocarbon structure, isobornyl (meth)acrylate, dicyclopentanyl (meth)acrylate, dicyclopentanyloxyethyl (meth)acrylate, dicyclopentenyl (meth)acrylate, adamantyl (meth)acrylate, tricyclodecanyl (meth)acrylate, tetracyclododecanyl (meth)acrylate, and the like are preferable.

In addition, in the case where (meth)acrylate is used as the polymerizable compound, acrylate is preferable to methacrylate from the viewpoint of excellent curability.

(Thixotropic Agent)

The curable compound may contain a thixotropic agent.

The thixotropic agent is an inorganic compound or an organic compound.

—Inorganic Compound—

One preferred aspect of the thixotropic agent is a thixotropic agent of an inorganic compound, and, for example, a needle-like compound, a chain-like compound, a flattened compound, or a layered compound can be preferably used. Among them, a layered compound is preferable.

The layered compound is not particularly limited and examples thereof include talc, mica, feldspar, kaolinite (kaolin clay), pyrophyllite (pyrophyllite clay), sericite (silk mica), bentonite, smectite-vermiculites (montmorillonite, beidellite, non-tronite, saponite, and the like), organic bentonite, and organic smectite.

These compounds may be used alone or in combination of two or more thereof. Examples of commercially available layered compounds include, as inorganic compounds, CROWN CLAY, BURGESS CLAY #60, BURGESS CLAY KF and OPTIWHITE (all manufactured by Shiraishi Kogyo Kaisha Ltd.), KAOLIN JP-100, NN KAOLIN CLAY, ST KAOLIN CLAY AND HARDSEAL (all manufactured by Tsuchiya Kaolin Ind., Ltd.), ASP-072, SATINTONPLUS, TRANSLINK 37 and HYDROUSDELAMI NCD (all manufactured by Angel Hard Corporation), SY KAOLIN, OS CLAY, HA CLAY and MC HARD CLAY (all manufactured by Maruo Calcium Co., Ltd.), RUCENTITE SWN, RUCENTITE SAN, RUCENTITE STN, RUCENTITE SEN and RUCENTITE SPN (all manufactured by Co-op Chemical Co., Ltd.), SUMECTON (manufactured by Kunimine Industries Co., Ltd.), BENGEL, BENGEL FW, ESBEN, ESBEN 74, ORGANITE and ORGANITE T (all manufactured by Hojun Co., Ltd.), HODAKA JIRUSIII, ORBEN, 250M, BENTONE 34 and BENTONE 38 (all manufactured by Wilbur-Ellis Company), and LAPONITE, LAPONITE RD and LAPONITE RDS (all manufactured by Nippon Silica Industrial Co., Ltd.). These compounds may also be dispersed in a solvent.

The thixotropic agent to be added to the coating liquid is, among layered inorganic compounds, a silicate compound represented by $xM(I)_2O \cdot ySiO_2$ (also including a compound corresponding to $M(II)O$ or $M(III)_2O_3$ having an oxidation number of 2 or 3; x and y represent a positive number), and a further preferred compound is a swellable layered clay mineral such as hectorite, bentonite, smectite, or vermiculite.

Particularly preferably, a layered (clay) compound modified with an organic cation (a compound in which an interlayer cation such as sodium in a silicate compound is exchanged with an organic cation compound) can be suitably used, and examples thereof include compounds in which a sodium ion in sodium magnesium silicate (hectorite) is exchanged with an ammonium ion which will be described below.

Examples of the ammonium ion include a monoalkyltrimethylammonium ion, a dialkyldimethylammonium ion and a trialkylmethylammonium ion, each having an alkyl chain having 6 to 18 carbon atoms, a dipolyoxyethylene-palm oil-alkylmethylammonium ion and a bis(2-hydroxyethyl)-palm oil-alkylmethylammonium ion, each having 4 to 18 oxyethylene chains, and a polyoxypropylene methyldiethylammonium ion having 4 to 25 oxopropylene chains. These ammonium ions may be used alone or in combination of two or more thereof.

The method for producing an organic cation-modified silicate mineral in which a sodium ion of sodium magnesium silicate is exchanged with an ammonium ion is as follows: sodium magnesium silicate is dispersed in water and sufficiently stirred, and thereafter allowed to stand for 16 hours or more to prepare a 4% by mass dispersion liquid; while this dispersion liquid is stirred, a desired ammonium salt is added in an amount of 30% by mass to 200% by mass relative to sodium magnesium silicate; after the addition, cation exchange takes place, and hectorite containing an ammonium salt between the layers becomes insoluble in water and precipitates, and therefore the precipitate is collected by filtration and dried. In the preparation, heating may also be carried out for the purpose of accelerating the dispersion.

Commercially available products of the alkylammonium-modified silicate mineral include RUCENTITE SAN, RUCENTITE SAN-316, RUCENTITE STN, RUCENTITE SEN, and RUCENTITE SPN (all manufactured by Co-op Chemical Co., Ltd.), which may be used alone or in combination of two or more thereof.

In the present embodiment, silica, alumina, silicon nitride, titanium dioxide, calcium carbonate, zinc oxide, or the like can be used as the thixotropic agent of an inorganic compound. These compounds may also be subjected to a treatment to adjust hydrophilicity or hydrophobicity on the surface, as necessary.

—Organic Compound—

For the thixotropic agent, a thixotropic agent of an organic compound can be used.

Examples of the thixotropic agent of an organic compound include an oxidized polyolefin and a modified urea.

The above-mentioned oxidized polyolefin may be independently prepared in-house or may be a commercially available product. Examples of commercially available products include DISPARLON 4200-20 (trade name, manufactured by Kusumoto Chemicals, Ltd.) and FLOWNON SA300 (trade name, manufactured by Kyoeisha Chemical Co., Ltd.).

The above-mentioned modified urea is a reaction product of an isocyanate monomer or an adduct thereof with an organic amine. The above-mentioned modified urea may be independently prepared in-house or may be a commercially available product. The commercially available product may be, for example, BYK 410 (manufactured by BYK-Chemie GmbH).

—Content—

The content of the thixotropic agent in the coating liquid is preferably 0.15 to 20 parts by mass, more preferably 0.2 to 10 parts by mass, and particularly preferably 0.2 to 8 parts by mass, with respect to 100 parts by mass of the curable compound. In particular, in the case of the thixotropic agent of an inorganic compound, the content of 20 parts by mass or less with respect to 100 parts by mass of the curable compound tends to improve brittleness.

(Polymerization Initiator)

The coating liquid may contain a known polymerization initiator as a polymerization initiator. With respect to the polymerization initiator, for example, reference can be made to paragraph [0037] of JP2013-043382A. The polymerization initiator is preferably in an amount of 0.1% by mol or more and more preferably 0.5% to 2% by mol based on the total amount of the curable compound contained in the coating liquid. In addition, the polymerization initiator is preferably contained in an amount of 0.1% by mass to 10% by mass and more preferably 0.2% by mass to 8% by mass, as the percentage by mass in the total curable composition excluding the volatile organic solvent.

—Photopolymerization Initiator—

The curable compound forming the resin layer 38 having impermeability to oxygen preferably contains a photopolymerization initiator. Any photopolymerization initiator may be used as long as it is a compound capable of generating an active species that polymerizes the polymerizable compound upon irradiation with light. Examples of the photopolymerization initiator include a cationic polymerization initiator and a radical polymerization initiator, among which a radical polymerization initiator is preferable. Further, in the present invention, a plurality of photopolymerization initiators may be used in combination.

The content of the photopolymerization initiator is, for example, 0.01% to 15% by mass, preferably 0.1% to 12% by mass, and more preferably 0.2% to 7% by mass, in the total composition excluding the solvent. In the case where two or more photopolymerization initiators are used, the total content thereof falls within the above range.

In the case where the content of the photopolymerization initiator is 0.01% by mass or more, sensitivity (fast curability) and coating film hardness tend to improve, which is preferable. On the other hand, in the case where the content of the photopolymerization initiator is 15% by mass or less, light transmittance, colorability, handleability, and the like tend to improve, which is preferable. In a system including a dye and/or a pigment, they may act as a radical trapping agent and affect photopolymerizability and sensitivity. In consideration of this point, in these applications, the addition amount of the photopolymerization initiator is optimized. On the other hand, in the composition used in the present invention, the dye and/or pigment is not an essential component, and the optimum range of the photopolymerization initiator may be different from that in the field of a curable composition for liquid crystal display color filter, or the like.

As the radical photopolymerization initiator, for example, a commercially available initiator can be used. The examples thereof include those described, for example, in paragraph [0091] of JP2008-105414A, which are preferably used. Among them, an acetophenone-based compound, an acylphosphine oxide-based compound, and an oxime ester-based compound are preferable from the viewpoint of curing sensitivity and absorption properties.

The acetophenone-based compound may be preferably, for example, a hydroxyacetophenone-based compound, a dialkoxyacetophenone-based compound, and an aminoacetophenone-based compound. The hydroxyacetophenone-based compound may be preferably, for example, Irgacure (registered trademark) 2959 (1-[4-(2-hydroxyethoxy)phenyl]-2-hydroxy-2-methyl-1-propan-1-one, Irgacure (registered trademark) 184 (1-hydroxycyclohexyl phenylketone), Irgacure (registered trademark) 500 (1-hydroxycyclohexyl phenylketone, benzophenone), and Darocur (registered trademark) 1173 (2-hydroxy-2-methyl-1-phenyl-1-propan-1-one), all of which are commercially available from BASF Corporation. The dialkoxyacetophenone-based compound may be preferably, for example, Irgacure (registered trademark) 651 (2,2-dimethoxy-1,2-diphenylethan-1-one) which is commercially available from BASF Corporation.

The aminoacetophenone-based compound may be preferably, for example, Irgacure (registered trademark) 369 (2-benzyl-2-dimethylamino-1-(4-morpholinophenyl)butanone-1), Irgacure (registered trademark) 379 (EG) (2-dimethylamino-2-(4-methylbenzyl)-1-(4-morpholin-4-yl phenyl)butan-1-one, and Irgacure (registered trademark) 907 (2-methyl-1-[4-methylthiophenyl]-2-morpholinopropan-1-one), all of which are commercially available from BASF Corporation.

The acylphosphine oxide-based compound may be preferably, for example, Irgacure (registered trademark) 819 (bis(2,4,6-trimethylbenzoyl)phenylphosphine oxide), and Irgacure (registered trademark) 1800 (bis(2,6-dimethoxybenzoyl)-2,4,4-trimethyl-pentylphosphinc oxide), all of which are commercially available from BASF Corporation, and Lucirin TPO (2,4,6-trimethylbenzoyldiphenylphosphine oxide) and Lucirin TPO-L (2,4,6-trimethylbenzoylphenylethoxyphosphine oxide), both of which are commercially available from BASF Corporation.

The oxime ester-based compound may be preferably, for example, Irgacure (registered trademark) OXE01 (1,2-octanedione, 1-[4-(phenylthio)phenyl]-2-(O-benzoyloxime)), Irgacure (registered trademark) OXE02 (ethanone, 1-[9-ethyl-6-(2-methylbenzoyl)-9H-carbazol-3-yl]–, and 1-(O-acetyloxime)), all of which are commercially available from BASF Corporation.

The cationic photopolymerization initiator is preferably a sulfonium salt compound, an iodonium salt compound, an oxime sulfonate compound, or the like, and examples thereof include 4-methylphenyl[4-(1-methylethyl)phenyliodonium tetrakis(pentafluorophenyl)borate (PI 2074 manufactured by Rhodia), 4-methylphenyl[4-(2-methylpropyl)phenyliodonium hexafluorophosphate (IRGACURE 250 manufactured by BASF Corporation), and IRGACURE PAG103, 108, 121, and 203 (all manufactured by BASF Corporation).

The photopolymerization initiator needs to be selected appropriately with respect to the wavelength of the light source to be used, but it is preferable that the photopolymerization initiator does not generate gas during mold pressurization/exposure. In the case where gas is generated, the mold is contaminated, so it is necessary to frequently clean the mold, or the photocurable composition is deformed in the mold, which contributes to problems such as deterioration of transfer pattern accuracy.

(Polymer)

The curable composition forming the resin layer 38 having impermeability to oxygen may contain a polymer. Examples of the polymer include poly(meth)acrylate, poly (meth)acrylamide, polyester, polyurethane, polyurea, polyamide, polyether, and polystyrene.

(Other Additives)

The coating liquid for forming a fluorescent region may contain a viscosity adjuster, a silane coupling agent, a surfactant, an antioxidant, an oxygen getter, a polymerization inhibitor, an inorganic particle, and the like.

—Viscosity Adjuster—

The coating liquid for forming a fluorescent region may contain a viscosity adjuster, if necessary. Addition of a viscosity adjuster makes it possible to adjust to the desired viscosity. The viscosity adjuster is preferably a filler having a particle diameter of 5 nm to 300 nm. In addition, the viscosity adjuster may be a thixotropic agent. In the present invention and the present specification, the term "thixotropy" refers to a property of decreasing the viscosity with increasing shear rate in a liquid composition, and the term "thixotropic agent" refers to a material having a function of imparting thixotropy to a composition by incorporation thereof into a liquid composition. Specific examples of the thixotropic agent include fumed silica, alumina, silicon nitride, titanium dioxide, calcium carbonate, zinc oxide, talc, mica, feldspar, kaolinite (kaolin clay), pyrophyllite (pyrophyllite clay), sericite (silk mica), bentonite, smectite-vermiculites (montmorillonite, beidellite, nontronite, saponite, and the like), organic bentonite, and organic smectite.

—Silane Coupling Agent—

The phosphor-containing layer formed from the coating liquid containing a silane coupling agent can exhibit excellent durability due to having strong adhesiveness to an adjacent layer due to the silane coupling agent. In addition, the phosphor-containing layer formed from the coating liquid containing a silane coupling agent is also preferable in forming the relationship of adhesion force A between support film and barrier layer<adhesion force B between phosphor-containing layer and barrier layer, under adhesion force conditions. This is mainly due to the fact that the silane coupling agent contained in the phosphor-containing layer forms a covalent bond with the surface of the adjacent layer or the constituent component of the phosphor-containing layer by hydrolysis reaction or condensation reaction. In the case where the silane coupling agent has a reactive functional group such as a radical polymerizable group, the formation of a crosslinking structure with a monomer component constituting the phosphor-containing layer can also contribute to an improvement in adhesiveness to the layer adjacent to the phosphor-containing layer.

For the silane coupling agent, a known silane coupling agent can be used without any limitation. From the viewpoint of adhesiveness, a preferred silane coupling agent may be, for example, a silane coupling agent represented by General Formula (1) described in JP2013-043382A.

General Formula (1)

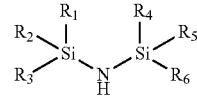

(In General Formula (1), $R_1$ to $R_6$ are each independently a substituted or unsubstituted alkyl group or aryl group, provided that at least one of $R_1, \ldots,$ or $R_6$ is a substituent containing a radical polymerizable carbon-carbon double bond.)

$R_1$ to $R_6$ are preferably an unsubstituted alkyl group or an unsubstituted aryl group, except for a case where $R_1$ to $R_6$ are a substituent containing a radical polymerizable carbon-carbon double bond. The alkyl group is preferably an alkyl group having 1 to 6 carbon atoms and more preferably a methyl group. The aryl group is preferably a phenyl group. $R_1$ to $R_6$ are each particularly preferably a methyl group.

It is preferable that at least one of $R_1, \ldots,$ or $R_6$ has a substituent containing a radical polymerizable carbon-carbon double bond, and two of $R_1$ to $R_6$ are a substituent containing a radical polymerizable carbon-carbon double bond. Further, it is particularly preferable that among $R_1$ to $R_3$, the number of those having a substituent containing a radical polymerizable carbon-carbon double bond is 1, and among $R_4$ to $R_6$, the number of those having a substituent containing a radical polymerizable carbon-carbon double bond is 1.

In the case where the silane coupling agent represented by General Formula (1) has two or more substituents containing a radical polymerizable carbon-carbon double bond, the respective substituents may be the same or different, and are preferably the same.

It is preferable that the substituent containing a radical polymerizable carbon-carbon double bond is represented by —X—Y where X is a single bond, an alkylene group having 1 to 6 carbon atoms, or an arylene group, preferably a single bond, a methylene group, an ethylene group, a propylene group, or a phenylene group; and Y is a radical polymerizable carbon-carbon double bond group, preferably an acryloyloxy group, a methacryloyloxy group, an acryloylamino group, a methacryloylamino group, a vinyl group, a propenyl group, a vinyloxy group, or a vinylsulfonyl group, and more preferably a (meth)acryloyloxy group.

$R_1$ to $R_6$ may also have a substituent other than the substituent containing a radical polymerizable carbon-carbon double bond. Examples of such a substituent include alkyl groups (for example, a methyl group, an ethyl group, an isopropyl group, a tert-butyl group, a n-octyl group, an n-decyl group, an n-hexadecyl group, a cyclopropyl group, a cyclopentyl group, and a cyclohexyl group), aryl groups (for example, a phenyl group and a naphthyl group), halogen atoms (for example, fluorine, chlorine, bromine, and iodine), acyl groups (for example, an acetyl group, a benzoyl group, a formyl group, and a pivaloyl group), acyloxy groups (for example, an acetoxy group, an acryloyloxy group, and a methacryloyloxy group), alkoxycarbonyl groups (for example, a methoxycarbonyl group and an ethoxycarbonyl group), aryloxycarbonyl groups (for example, a phenyloxycarbonyl group), and sulfonyl groups (for example, a methanesulfonyl group and a benzenesulfonyl group).

The silane coupling agent is contained in the coating liquid in the range of preferably 1% to 30% by mass, more preferably 3% to 30% by mass, and still more preferably 5% to 25% by mass, from the viewpoint of further improving the adhesiveness to the adjacent layer.

—Surfactant—

The coating liquid for forming a fluorescent region may contain at least one surfactant containing fluorine atoms in an amount of 20% by mass or more.

The surfactant preferably contains 25% by mass or more of fluorine atoms and more preferably 28% by mass or more of fluorine atoms. The upper limit value of the fluorine atom content is not specifically defined, but it is, for example, 80% by mass or less and preferably 70% by mass or less.

The surfactant used in the present invention is preferably a compound having an alkyl group having a fluorine atom, a cycloalkyl group having a fluorine atom, or an aryl group having a fluorine atom.

The alkyl group containing a fluorine atom is a linear or branched alkyl group in which at least one hydrogen atom is substituted with a fluorine atom. The alkyl group preferably has 1 to 10 carbon atoms and more preferably 1 to 4 carbon atoms. The alkyl group containing a fluorine atom may further have a substituent other than a fluorine atom.

The cycloalkyl group containing a fluorine atom is a monocyclic or polycyclic cycloalkyl group in which at least one hydrogen atom is substituted with a fluorine atom. The cycloalkyl group containing a fluorine atom may further have a substituent other than a fluorine atom.

The aryl group containing a fluorine atom is an aryl group in which at least one hydrogen atom is substituted with a fluorine atom. Examples of the aryl group include a phenyl group and a naphthyl group. The aryl group containing a fluorine atom may further have a substituent other than a fluorine atom.

By having such a structure, it is considered that the surface uneven distribution ability becomes satisfactory, and partial compatibility with the polymer occurs and phase separation is suppressed.

The molecular weight of the surfactant is preferably 300 to 10,000 and more preferably 500 to 5,000.

The content of the surfactant is, for example, 0.01% to 10% by mass, preferably 0.1% to 7% by mass, and more preferably 0.5% to 4% by mass in the total composition excluding the solvent. In the case where two or more surfactants are used, the total content thereof falls within the above range.

Examples of the surfactant include FLUORAD FC-430 and FC-431 (trade names, manufactured by Sumitomo 3M Ltd.), SURFLON S-382 (trade name, manufactured by Asahi Glass Co., Ltd.), EFTOP "EF-122A, 122B, 122C, EF-121, EF-126, EF-127, and MF-100" (manufactured by Tohkem Products Corporation), PF-636, PF-6320, PF-656 and PF-6520 (trade names, all manufactured by OMNOVA Solutions, Inc.), FTERGENT FT250, FT251 and DFX18 (trade names, all manufactured by NEOS Co., Ltd.), UNIDYNE DS-401, DS-403 and DS-451 (trade names, all manufactured by Daikin Industries Ltd.), MEGAFACE 171, 172, 173, 178K and 178A (trade names, all manufactured by DIC Corporation), X-70-090, X-70-091, X-70-092 and X-70-093 (trade names, all manufactured by Shin-Etsu Chemical Co., Ltd.), and MEGAFACE R-08 and XRB-4 (trade names, all manufactured by DIC Corporation).

—Antioxidant—

The curable compound forming the resin layer 38 having impermeability to oxygen preferably contains a known antioxidant. The antioxidant is for suppressing color fading by heat or photo-irradiation, and for suppressing color fading by various oxidizing gases such as ozone, active oxygen $NO_X$, and $SO_X$ (X is an integer). Especially in the present invention, addition of the antioxidant brings about advantages that the cured film is prevented from being colored and the film thickness is prevented from being reduced through decomposition.

Further, two or more antioxidants may be used as the antioxidant.

The content of the antioxidant in the curable compound forming the resin layer 38 having impermeability to oxygen is preferably 0.2% by mass or more, more preferably 1% by mass or more, and still more preferably 2% by mass or more with respect to the total mass of the curable compound. On the other hand, the antioxidant may be altered due to the interaction with oxygen. The altered antioxidant may induce decomposition of the quantum dot-containing polymerizable composition, resulting in lowering of adhesiveness, brittleness deterioration, and lowering of quantum dot luminous efficiency. From the viewpoint of preventing these deteriorations, the content of the antioxidant is preferably 20% by mass or less, more preferably 15% by mass or less, and still more preferably 10% by mass or less.

The antioxidant is preferably at least one of a radical inhibitor, a metal deactivator, a singlet oxygen scavenger, a superoxide scavenger, or a hydroxy radical scavenger. Examples of the antioxidant include a phenol-based antioxidant, a hindered amine-based antioxidant, a quinone-based antioxidant, a phosphorus-based antioxidant, and a thiol-based antioxidant.

Examples of the phenol-based antioxidant include 2,6-di-tert-butyl-p-cresol, 2,6-diphenyl-4-octadecyloxyphenol, distearyl (3,5-di-tert-butyl-4-hydroxybenzyl)phosphonate, 1,6-hexamethylenebis[(3,5-di-tert-butyl-4-hydroxyphenyl) propionic acid amide], 4,4'-thiobis(6-tert-butyl-m-cresol), 2,2'-methylenebis(4-methyl-6-tert-butylphenol), 2,2'-methylenebis(4-ethyl-6-tert-butylphenol), 4,4'-butylidenebis(6-tert-butyl-m-cresol), 2,2'-ethylidenebis(4,6-di-tert-butylphenol), 2,2'-ethylidenebis(4-sec-butyl-6-tert-butylphenol), 1,1,3-tris(2-methyl-4-hydroxy-5-tert-butylphenyl)butane, 1,3,5-tris(2,6-dimethyl-3-hydroxy-4-tert-butylbenzyl) isocyanurate, 1,3,5-tris(3,5-di-tert-butyl-4-hydroxybenzyl) isocyanurate, 1,3,5-tris(3,5-di-tert-butyl-4-hydroxybenzyl)-2,4,6-trimethylbenzene, 2-tert-butyl-4-methyl-6-(2-acryloyloxy-3-tert-butyl-5-methylbenzyl)phenol, stearyl(3,5-di-tert-butyl-4-hydroxyphenyl)propionate, tetrakis[3-(3,5-di-tert-butyl-4-hydroxyphenyl)propionic acid methyl] methane ((ADEKASTAB AO-60, manufactured by ADEKA Corporation)), thiodiethylene glycol bis[(3,5-di-tert-butyl-4-hydroxyphenyl)propionate], 1,6-hexamethylene bis[(3,5-di-tert-butyl-4-hydroxyphenyl)propionate], bis [3,3-bis(4-hydroxy-3-tert-butylphenyl)butyl acid]glycol ester, bis[2-tert-butyl-4-methyl-6-(2-hydroxy-3-tert-butyl-5-methylbenzyl) phenyl]terephthalate, 1,3,5-tris[(3,5-di-tert-butyl-4-hydroxyphenyl)propionyloxyethyl]isocyanurate, 3,9-bis[1,1-dimethyl-2-{(3-tert-butyl-4-hydroxy-5-methylphenyl) propionyloxy}ethyl]-2,4,8,10-tetraoxaspiro[5,5]undecane, and triethylene glycol bis[(3-tert-butyl-4-hydroxy-5-methylphenyl)propionate].

Examples of the phosphorus-based antioxidant include trisnonylphenyl phosphite, tris[2-tert-butyl-4-(3-tert-butyl-4-hydroxy-5-methylphenylthio)-5-methylphenyl]phosphite, tridecyl phosphite, octyldiphenyl phosphite, di(decyl)monophenyl phosphite, di(tridecyl)pentaerythritol diphosphite, di(nonylphenyl)pentaerythritol diphosphite, bis(2,4-di-tert-butylphenyl)pentaerythritol diphosphite, bis(2,6-di-tert-butyl-4-methylphenyl)pentaerythritol diphosphite, bis(2,4,6-tri-tert-butylphenyl)pentaerythritol diphosphite, bis(2,4-dicumylphenyl)pentaerythritol diphosphite, tetra(tridecyl) isopropylidenediphenol diphosphite, tetra(tridecyl)-4,4'-n-butylidene bis(2-tert-butyl-5-methylphenol)diphosphite, hexa(tridecyl)-1,1,3-tris(2-methyl-4-hydroxy-5-tert-butylphenyl)butane triphosphite, tetrakis(2,4-di-tert-butylphenyl)biphenylene diphosphonite, 9,10-dihydro-9-oxa-10-phosphaphenanthrene-10-oxide, 2,2'-methylene-bis (4,6-tert-butylphenyl)-2-ethylhexyl phosphite, 2,2'-methylene-bis(4,6-tert-butylphenyl)-octadecyl phosphite, 2,2'-ethylidene-bis(4,6-di-tert-butylphenyl)fluorophosphite, tris(2-[(2,4,8,10-tetrakis-tert-butyldibenzo[d,f][1,3,2]dioxaphosphepin-6-yl)oxy]ethyl)amine, and phosphites of 2-ethyl-2-butylpropylene glycol and 2,4,6-tri-tert-butylphenol. The amount of these phosphorus-based antioxidants added is preferably 0.001 to 10 parts by mass and particularly preferably 0.05 to 5 parts by mass, with respect to 100 parts by mass of the polyolefin-based resin.

Examples of the thiol-based antioxidant include dialkyl thiodipropionates such as dilauryl thiodipropionate, dimyristyl thiodipropionate, and distearyl thiodipropionate; and pentaerythritol tetra($\beta$-alkyl mercaptopropionic acid) esters.

The hindered amine-based antioxidant is also referred to as a hindered amine light stabilizer (HALS), and has a structure in which all hydrogen atoms on carbons at 2- and 6-positions of piperidine are substituted with methyl groups, preferably a group represented by Formula 1. In Formula 1, X represents a hydrogen atom or an alkyl group. Among the groups represented by Formula 1, HALS having a 2,2,6,6-tetramethyl-4-piperidyl group in which X is a hydrogen atom, or a 1,2,2,6,6-pentamethyl-4-piperidyl group in which X is a methyl group is particularly preferably adopted. A number of HALS having a structure in which a group represented by Formula 1 is bonded to a —COO— group, that is, a group represented by Formula 2 are commercially available, but these can be preferably used.

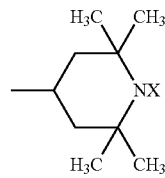

(Formula 1)

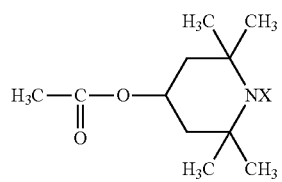

(Formula 2)

Specific examples of HALS that can be preferably used in the present invention include those represented by the following formulae. Here, the 2,2,6,6-tetramethyl-4-piperidyl group is represented by R and the 1,2,2,6,6-pentamethyl-4-piperidyl group is represented by R'.

ROC(=O)(CH$_2$)$_8$C(=O)OR, ROC(=O)C(CH$_3$)=CH$_2$, R'OC(=O)C(CH$_3$)=CH$_2$, CH$_2$(COOR)CH(COOR)CH (COOCOOR(COOR)CH$_2$COOR, CH$_2$(COOR')CH (COOR')CH(COOR')CH$_2$COOR', a compound represented by Formula 3, and the like.

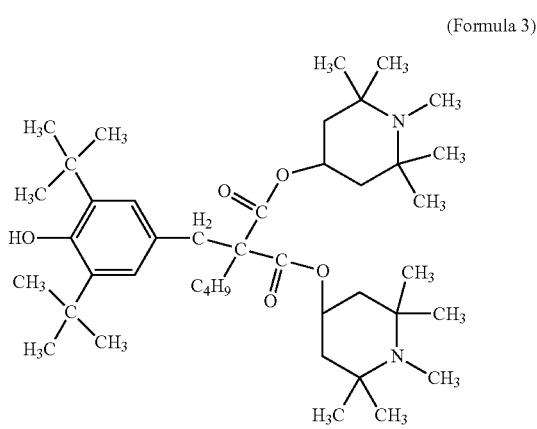

(Formula 3)

Specific examples of HALS include hindered amine compounds such as 2,2,6,6-tetramethyl-4-piperidylstearate, 1,2,2,6,6-pentamethyl-4-piperidylstearate, 2,2,6,6-tetramethyl-4-piperidylbenzoate, bis(2,2,6,6-tetramiethyl-4-piperidyl) sebacate, bis(1,2,2,6,6-pertamethyl-4-piperidyl)sebacate, bis(1-octoxy-2,2,6,6-tetramethyl-4-piperidyl)sebacate, tetrakis(2,2,6,6-tetramiethyl-4-piperidyl)-1,2,3,4-butane tetracarboxylate, tetrakis(1,2,2,6,6-pentamethyl-4-piperidyl)-1,2,3,4-butane tetracarboxylate, bis(2,2,6,6-tetramethyl-4-piperidyl)-di(tridecyl)-1,2,3,4-butane tetracarboxylate, bis(1,2,2,6,6-pentamethyl-4-piperidyl)-di(tridecyl)-1,2,3,4-butane tetracarboxylate, bis(1,2,2,4,4-pentamethyl-4-piperidyl)-2-butyl-2-(3,5-di-tert-butyl-4-hydroxybenzyl) malonate 1-(2-hydroxyethyl)-2,2,6,6-tetramethyl-4-piperidinol/diethyl succinate polycondensate, 1,6-bis(2,2,6,6-tetramethyl-4-piperidylamino)hexane/2,4-dichloro-6-morpholino-s-triazine polycondensate, 1,6-bis(2,2,6,6-tetramethyl-4-piperidylamino)hexane/2,4-dichloro-6-tert-octylamino-s-triazine polycondensate, 1,5,8,12-tetrakis[2,4-bis(N-butyl-N-(2,2,6,6-tetramethyl-4-piperidyl)amino)-s-triazin-6-yl]-1,5,8,12-tetraazadodecane, 1,5,8,12-tetrakis[2,4-bis(N-butyl-N-(1,2,2,6,6-pentamethyl-4-piperidyl)amino)-s-triazin-6-yl]-1,5,8,12-tetraazadodecane, 1,6,11-tris[2,4-bis(N-butyl-N-(2,2,6,6-tetramethyl-4-piperidyl)amino)-s-triazin-6-yl]aminoundecane, and 1,6,11-tris[2,4-bis(N-butyl-N-(1,2,2,6,6-pentamethyl-4-piperidyl)amino)-s-triazin-6-yl]aminoundecane.

Specific products of HALS include, but are not limited to, TINUVIN 123, TINUVIN 144, TINUVIN 765, TINUVIN 770, TINUVIN 622, CHIMASSORB 944, and CHIMASSORB 119 (all of which are trade names of Ciba Specialty Chemicals Inc.), ADEKASTAB LA 52, ADEKASTAB LA 57, ADEKASTAB LA-62, ADEKASTAB LA-67, ADEKASTAB LA 82, ADEKASTAB LA 87, and ADEKASTAB LX 335 (all of which are trade names of Asahi Denka Kogyo KK).

Among the HALS, those having a relatively small molecular weight are preferable because of easy diffusion from the resin layer to the fluorescent region. Preferred HALS in this viewpoint are compounds represented by ROC(=O)(CH$_2$)$_8$C(=O)OR, R'OC(=O)C(CH$_3$)=CH$_2$, and the like.

Among the above-mentioned antioxidants, at least one of a hindered phenol compound, a hindered amine compound, a quinone compound, a hydroquinone compound, a tocopherol compound, an aspartic acid compound, or a thiol compound is more preferable, and at least one of a citric acid compound, an ascorbic acid compound, or a tocopherol compound is still more preferable. Although these compounds are not particularly limited, preferred examples thereof include hindered phenol, hindered amine, quinone, hydroquinone, tocopherol, aspartic acid, thiol, citric acid, tocopheryl acetate, and tocopheryl phosphate per se, and salts or ester compounds thereof.

One example of the antioxidant is shown below.

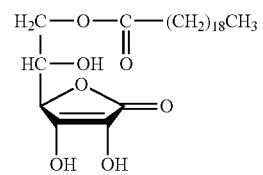

Ascorbic acid stearic acid ester

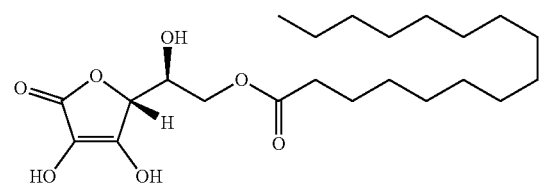

Ascorbic acid palmitic acid ester (ascorbyl palmitate)

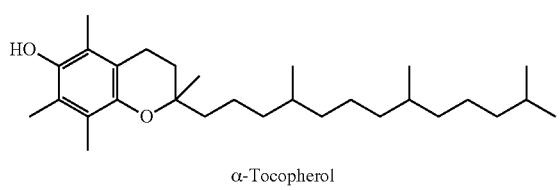

α-Tocopherol

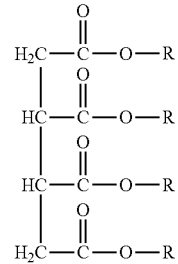

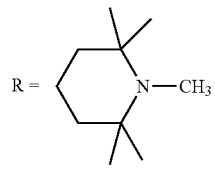

Tetrakis(1,2,2,6,6-pentamethyl-4-piperidyl)butane-1,2,3,4-tetracarboxylate
(trade name: ADEKASTAB LA-52, manufactured by ADEKA Corporation)

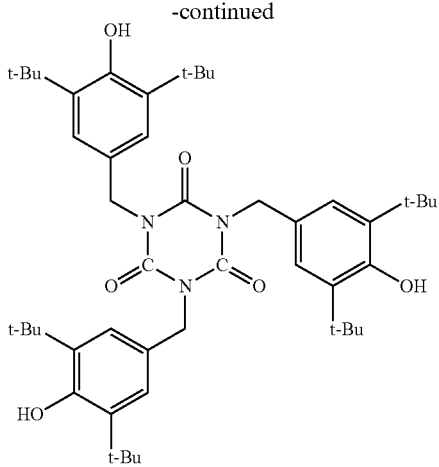

1,3,5-tris(3,5-di-tert-butyl-4-hydroxybenzyl)-1,3,5-triazine-2,4,6 (1H, 3H, 5H)-trione
(trade name: ADEKASTAB AO-20, manufactured by ADEKA Corporation)

B-3

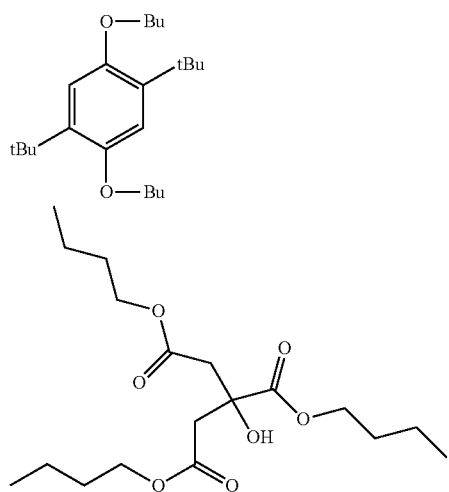

Tributyl citrate

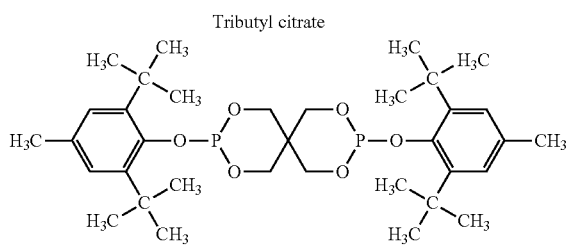

3,9-bis(2,6-di-tert-butyl-4-methylphenoxy)-2,4,8,10-tetraoxa-3,9-diphosphaspiro[5,5] undecane
(trade name: ADEKASTAB PEP-36, manufactured by ADEKA Corporation)

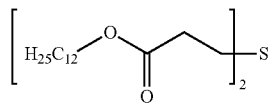

Dilauryl thiodipropionate (IRGANOX PS 800, 800FD, manufactured by BASF Corporation)

—Oxygen Getter—

A known substance used as a getter of an organic EL device can be used as the oxygen getter. The oxygen getter may be either an inorganic getter or an organic getter, and is preferable to include at least one compound selected from a metal oxide, a metal halide, a metal sulfate, a metal perchlorate, a metal carbonate, a metal alkoxide, a metal carboxylate, a metal chelate, or a zeolite (aluminosilicate).

Examples of such an oxygen getter include calcium oxide (CaO), barium oxide (BaO), magnesium oxide (MgO), strontium oxide (SrO), lithium sulfate ($Li_2SO_4$), sodium sulfate ($Na_2SO_4$), calcium sulfate ($CaSO_4$), magnesium sulfate ($MgSO_4$), cobalt sulfate ($CoSO_4$), gallium sulfate ($Ga_2(SO_4)_3$), titanium sulfate ($Ti(SO_4)_2$), and nickel sulfate ($NiSO_4$).

The organic getter is not particularly limited as long as it is a material that takes in water by a chemical reaction and does not become opaque before and after the reaction. Here, the organometallic compound means a compound having a metal-carbon bond, a metal-oxygen bond, a metal-nitrogen bond or the like. In the case where water reacts with the organometallic compound, the above-mentioned bond of the compound breaks due to a hydrolysis reaction to result in a metal hydroxide. Depending on the metal, hydrolytic polycondensation may be carried out to increase the molecular weight after the reaction into the metal hydroxide.

As the metal of the metal alkoxide, the metal carboxylate, and the metal chelate, it is preferable to use a metal having good reactivity with water as the organometallic compound, that is, a metal atom which is easily breakable from a variety of bonds by the action of water. Specific examples thereof include aluminum, silicon, titanium, zirconium, bismuth, strontium, calcium, copper, sodium, and lithium. In addition, cesium, magnesium, barium, vanadium, niobium, chromium, tantalum, tungsten, chromium, indium, iron, and the like can be mentioned. In particular, a desiccating agent of an organometallic compound having aluminum as a central metal is preferable in terms of dispersibility in a resin and reactivity with water. Examples of the organic group include an unsaturated hydrocarbon such as a methoxy group, an ethoxy group, a propoxy group, a butoxy group, a 2-ethylhexyl group, an octyl group, a decyl group, a hexyl group, an octadecyl group, a stearyl group, a saturated hydrocarbon, a branched unsaturated hydrocarbon, a branched saturated hydrocarbon, an alkoxy group or carboxyl group containing a cyclic hydrocarbon, and a β-diketonato group such as an acetoacetonato group or a dipivaloylmethanato group.

Among them, aluminum ethyl acetoacetates having 1 to 8 carbon atoms shown in the following chemical formulae are suitably used from the viewpoint that a sealing composition having excellent transparency can be formed.

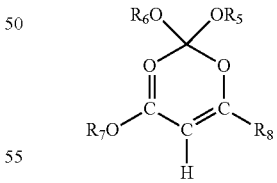

(in the formula, $R_5$ to $R_8$ each represent an organic group including an alkyl group, an aryl group, an alkoxy group, a cycloalkyl group or an acyl group, each of which has 1 to 8 carbon atoms, and M represents a trivalent metal atom. In addition, $R_5$ to $R_8$ may be the same organic group or different organic group.)

The above-mentioned aluminum ethyl acetoacetates having 1 to 8 carbon atoms are commercially available, for example, from Kawaken Fine Chemical Co., Ltd. or Hope Pharmaceutical Co., Ltd.

The oxygen getter is in particulate or powder form. The average particle diameter of the oxygen getter may be usually in the range of less than 20 μm, preferably 10 μm or less, more preferably 2 μm or less, and still more preferably 1 μm or less. From the viewpoint of scattering property, the average particle diameter of the oxygen getter is preferably 0.3 to 2 μm and more preferably 0.5 to 1.0 μm. The term "average particle diameter" as used herein refers to an average value of particle diameters calculated from a particle size distribution measured by a dynamic light scattering method.

—Polymerization Inhibitor—

The curable compound forming the resin layer 38 having impermeability to oxygen preferably contains a polymerization inhibitor. The content of the polymerization inhibitor is 0.001% to 1% by mass, more preferably 0.005% to 0.5% by mass, and still more preferably 0.008% to 0.05% by mass, with respect to all the polymerizable monomers, and changes in viscosity over time can be suppressed while maintaining a high curing sensitivity by blending the polymerization inhibitor in an appropriate amount. The polymerization inhibitor may be added at the time of production of the polymerizable monomer or may be added later to the curable composition. Preferred examples of the polymerization inhibitor include hydroquinone, p-methoxyphenol, di-tert-butyl-p-cresol, pyrrogallol, tert-butylcatechol, benzoquinone, 4,4'-thiobis(3-methyl-6-tert-butylphenol), 2,2'-methylenebis(4-methyl-6-tert-butylphenol), cerous N-nitrosophenylhydroxyamine, phenothiazine, phenoxazine, 4-methoxynaphthol, 2,2,6,6-tetramethylpiperidine-1-oxyl free radical, 2,2,6,6-tetramethylpiperidine, 4-hydroxy-2,2,6,6-tetramethylpiperidine-1-oxyl free radical, nitrobenzene, and dimethylaniline, among which preferred is p-benzoquinone, 2,2,6,6-tetramethylpiperidine-1-oxyl free radical, 4-hydroxy-2,2,6,6-tetramethylpiperidine-1-oxyl free radical, or phenothiazine. These polymerization inhibitors suppress generation of polymer impurities not only during the production of the polymerizable monomers but also during storage of the curable composition and suppress degradation of pattern formability during imprinting.

<<Resin Layer Having Impermeability to Oxygen>>

The resin layer 38 having impermeability to oxygen is formed by applying and curing a resin forming coating liquid containing the above-mentioned curable compound. The oxygen permeability at the shortest distance between adjacent fluorescent regions 35 of the resin layer 38 preferably satisfies 10 cc/(m$^2$·day·atm) or less. The oxygen permeability at the shortest distance between adjacent fluorescent regions 35 of the resin layer 38 is more preferably 1 cc/(m$^2$·day·atm) or less and still more preferably $10^{-1}$ cc/(m$^2$·day·atm) or less. The shortest distance necessary between the fluorescent regions 35 varies depending on the composition of the resin layer 38.

With respect to oxygen permeability, fm/(s·Pa) can be used as the SI unit. It is possible to carry out conversion of units as a relationship of 1 fm/(s·Pa)=8.752 cc/(m$^2$·day·atm). fm is read as femtometer and 1 fm=$10^{-15}$ m.

Depending on the composition of the resin layer 38, the shortest distance necessary between the fluorescent regions 35 varies. The shortest distance between adjacent fluorescent regions 35 of the resin layer 38 refers to the shortest distance in the film plane between the resin and the phosphor region in the case where it is observed from the phosphor-containing film main surface. In the following description, the shortest distance between adjacent fluorescent regions 35 of the resin layer 38 may be referred to as the width of the resin layer.

As described above, the shortest distance necessary between the phosphor regions 35 varies depending on the composition of the resin layer 38, but as an example, the shortest distance between adjacent fluorescent regions 35 of the resin layer 38, that is, the width of the resin layer is preferably 0.001 mm or more and 3 mm or less, more preferably 0.01 mm or more and 2 mm or less, and particularly preferably 0.03 mm or more and 2 mm or less. In the case where the width of the resin layer is too short, it is difficult to secure the necessary oxygen permeability, and in the case where the width of the resin layer is too long, luminance unevenness of a display device deteriorates, which is not preferable.

The ratio of the volume Vp of the fluorescent region to the volume Vb of the resin layer can be arbitrary, but the ratio of the volume Vp of the fluorescent region to the volume (Vp+Vb) of the entire phosphor-containing layer is preferably $0.1 \leq Vp/(Vp+Vb) < 0.9$, more preferably $0.2 \leq Vp/(Vp+Vb) < 0.85$, and particularly preferably $0.3 \leq Vp/(Vp+Vb) < 0.8$. In the case where the volume ratio of the fluorescent region is too small, the initial luminance at a certain thickness tends to decrease, and in the case where the volume ratio of the fluorescent region is too large, the width of the resin layer becomes short, and as a result, it becomes difficult to secure the necessary oxygen permeability. Note that a region Vp containing phosphors and a region Vb of a resin layer having oxygen impermeability are defined as being multiplied by each area and thickness in the case where observed from the phosphor-containing film main surface.

The material for forming the resin layer 38 is preferably a compound having a di- or higher functional photopolymerizable crosslinking group, and examples thereof include alicyclic (meth)acrylate such as urethane (meth)acrylate or tricyclodecanedimethanol di(meth)acrylate; (meth)acrylate having a hydroxyl group such as pentaerythritol triacrylate; aromatic (meth)acrylate such as modified bisphenol A di(meth)acrylate; dipentaerythritol di(meth)acrylate, 3,4-epoxycyclohexylmethyl (meth)acrylate, 3',4'-epoxycyclohexylmethyl 3,4-epoxycyclohexane carboxylate, and bisphenol A type epoxy. Among them, it is preferable to include at least urethane (meth)acrylate and an epoxy compound from the viewpoint of enhancing the impermeability to oxygen. By using a compound having a urethane bond or a polar functional group such as a hydroxyl group or a carboxyl group to enhance intermolecular interaction, a resin layer having high impermeability to oxygen can be obtained. It is preferable to include a compound having the same polymerizable crosslinking group as that of the fluorescent region from the viewpoint of excellent adhesion between the resin layer and the fluorescent region. For example, in the case where dicyclopentanyl (meth)acrylate or the like is contained in the material of the fluorescent region, the resin layer suitably contains at least a (meth)acrylate compound.

From the viewpoint of satisfying the condition that the formed resin layer 38 has a Knoop hardness of 115 N/mm$^2$ to 285 N/mm$^2$, a creep recovery rate of 22% or less, and an elastic recovery rate of 60% or more, it is preferable to use a (meth)acrylate-based compound or an epoxy-based compound, in particular, a polyfunctional (meth)acrylate compound or an epoxy (meth)acrylate compound, as the curable compound.

The curable compound for forming the resin layer 38 of the present invention having impermeability to oxygen may contain both a (meth)acrylate compound having an aromatic structure and/or an alicyclic hydrocarbon structure and a (meth)acrylate having a fluorine atom as the polymerizable compound. As for the compounding ratio, it is preferable that 80% by mass or more of the total polymerizable compound component is a (meth)acrylate compound having an aromatic structure and/or an alicyclic hydrocarbon structure, and 0.1% to 10% by mass of the total polymerizable compound component is a (mcth)acrylate having a fluorine atom. Further, preferred is a blend system in which the (meth)acrylatc compound having an aromatic structure and/or alicyclic hydrocarbon structure is liquid at 1 atm and 25° C. and the (meth)acrylate having a fluorine atom is solid at 1 atm and 25° C.

From the viewpoint of improving the curability and improving the viscosity of the curable compound, the total content of the polymerizable compound in the curable compound forming the resin layer 38 having impermeability to oxygen is preferably 50% to 99.5% by mass, more preferably 70% to 99% by mass, and particularly preferably 90% to 99% by mass, in all the components excluding the solvent.

More preferably, as for the polymerizable compound component in the curable compound forming the resin layer 38 having impermeability to oxygen, with respect to the total polymerizable compound, it is preferable that the content of the polymerizable compound having a viscosity of 3 to 2,000 mPa·s at 25° C. is 80% by mass or more, it is more preferable that the content of the polymerizable compound having a viscosity of 5 to 1,000 mPa·s at 25° C. is 80% by mass or more, it is particularly preferable that the content of the polymerizable compound having a viscosity of 7 to 500 mPa·s at 25° C. is 80% by mass or more, and it is most preferable that the content of the polymerizable compound having a viscosity of 10 to 300 mPa·s at 25° C. is 80% by mass or more.

As for the polymerizable compound included in the curable compound forming the resin layer 38 having impermeability to oxygen, it is preferable that the polymerizable compound, which is liquid at 25° C., is 50% by mass or more in the total polymerizable compound, from the viewpoint of temporal stability.

The curable compound forming the resin layer 38 having impermeability to oxygen is preferably a radical polymerizable curable composition in which the polymerizable compound is a radical polymerizable compound and the photopolymerization initiator is a radical polymerization initiator that generates radicals upon irradiation with light.

The curable compound forming the resin layer 38 having impermeability to oxygen may contain at least one surfactant containing 20% by mass or more of fluorine atoms.

The curable compound forming the resin layer 38 having impermeability to oxygen preferably contains a known oxygen getter.

In the curable compound forming the resin layer 38 having impermeability to oxygen, the oxygen getter is preferably 0.1% to 20% by mass, more preferably 0.1% to 15% by mass, and still more preferably 0.1% to 10% by mass, with respect to the total mass of the curable compound.

Further, the curable compound forming the resin layer 38 having impermeability to oxygen preferably contains inorganic particles. Incorporation of inorganic particles can provide an enhanced impermeability to oxygen. Examples of inorganic particles include inorganic layered compounds such as silica particles, alumina particles, zirconium oxide particles, zinc oxide particles, titanium oxide particles, mica, and talc. The inorganic particles are preferably plate-like from the viewpoint of enhancing the impermeability to oxygen, and the aspect ratio (r=a/b, where a>b) of the inorganic particles is preferably 2 or more and 1000 or less, more preferably 10 or more and 800 or less, and particularly preferably 20 or more and 500 or less. A larger aspect ratio is preferable because it has an excellent effect of enhancing the impermeability to oxygen. However, in the case where the aspect ratio is too large, physical strength of a film or particle dispersibility in a curing composition is poor.

In addition to the above-mentioned components, a releasing agent, a silane coupling agent, an ultraviolet absorber, a light stabilizer, an anti-aging agent, a plasticizer, an adhesion promoter, a thermal polymerization initiator, a colorant, elastomer particles, a photoacid proliferating agent, a photobase generator, a basic compound, a flow adjusting agent, an anti-foaming agent, a dispersant, or the like may be added to the curable compound forming the resin layer 38 having impermeability to oxygen.

The method for preparing the curable composition forming the resin layer 38 having impermeability to oxygen is not particularly limited, and it may be carried out by a procedure for preparing a common curable composition.

—Substrate Film—

The first substrate film 10 and the second substrate film 20 are preferably a film having a function of suppressing permeation of oxygen. The above-mentioned embodiment has a configuration in which the barrier layers 12 and 22 are provided on one surface of the support films 11 and 21, respectively. In such an embodiment, the presence of the support films 11 and 21 improves the strength of the phosphor-containing film and makes it possible to easily perform film formation. In the present embodiment, the barrier layers 12 and 22 are provided on one surface of the support films 11 and 21, but the substrate film may be constituted by only a support having sufficient barrier properties.

The first substrate film 10 and the second substrate film 20 have a total light transmittance in the visible light region of preferably 80% or more and more preferably 85% or more. The visible light region refers to a wavelength range of 380 to 780 nm, and the total light transmittance refers to an average value of light transmittances over the visible light region.

The oxygen permeability of the first substrate film 10 and the second substrate film 20 is preferably 1.00 cc/(m²·day·atm) or less. The oxygen permeability is more preferably 0.1 cc/(m²·day·atm) or less, still more preferably 0.01 cc/(m² day·atm) or less, and particularly preferably 0.001 cc/(m²·day·atm) or less. The oxygen permeability here is a value measured using an oxygen gas permeability measuring apparatus (OX-TRAN 2/20, trade name, manufactured by MOCON Inc.) under conditions of a measurement temperature of 23° C. and a relative humidity of 90%.

In addition to having a gas barrier function of blocking oxygen, the first substrate film 10 and the second substrate film 20 preferably have a function of blocking moisture (water vapor). The moisture permeability (water vapor permeability) of the first substrate film 10 and the second substrate film 20 is preferably 0.10 g/(m²·day·atm) or less and more preferably 0.01 g/(m²·day·atm) or less.

(Support Film)

The support films 11 and 21 are preferably a flexible belt-like support which is transparent to visible light. The phrase "transparent to visible light" as used herein refers to a light transmittance in the visible light region of 80% or more and preferably 85% or more. The light transmittance for use as a measure of transparency can be calculated by the method described in JIS-K7105, namely, by measuring a total light transmittance and an amount of scattered light using an integrating sphere type light transmittance measuring apparatus, and subtracting the diffuse transmittance from the total light transmittance. With respect to the flexible support, reference can be made to paragraphs [0046] to [0052] of JP2007-290369A and paragraphs [0040] to [0055] of JP2005-096108A.

The support film preferably has barrier properties against oxygen and moisture. Preferred examples of such a support film include a polyethylene terephthalate film, a film made of a polymer having a cyclic olefin structure, and a polystyrene film.

From the viewpoint of gas barrier properties, impact resistance, and the like, the thickness of the support film is in the range of 10 to 500 μm, inter alia, preferably in the range of 15 to 300 μm, particularly preferably in the range of 15 to 120 μm, more particularly preferably in the range of 15 to 100 μm, further preferably 25 to 110 μm, and most preferably 25 to 60 μm.

Further, in the support films 11 and 21, the in-plane retardation Re (589) at a wavelength of 589 nm is preferably 1000 nm or less, more preferably 500 nm or less, and still more preferably 200 nm or less.

In the case of inspecting the presence or absence of foreign matters and defects after preparing the phosphor-containing film, arranging two polarizing plates at the extinction position, inserting a phosphor-containing film therebetween and observing it makes it easy to find foreign matters and defects. In the case where the Re (589) of the support is within the above range, foreign matters and defects are more easily found at the time of inspection using a polarizing plate, which is thus preferable.

Here, the Re (589) can be measured by making light having an input wavelength of 589 nm incident in the normal direction of the film using an AxoScan OPMF-1 (manufactured by Opto Science, Inc.).

(Barrier layer) The first substrate film 10 and the second substrate film 20 preferably comprise barrier layers 12 and 22 containing at least one inorganic layer formed in contact with the surface of the support films 11 and 21 on the phosphor-containing layer 30 side. The barrier layers 12 and 22 may include at least one inorganic layer and at least one organic layer. Lamination of a plurality of layers in this way is preferable from the viewpoint of improving the light resistance due to being capable of further more enhancing barrier properties. On the other hand, the light transmittance of the substrate film tends to decrease as the number of layers to be laminated is increased, and therefore it is desirable to increase the number of laminated layers as long as a satisfactory light transmittance can be maintained.

Specifically, the barrier layers 12 and 22 preferably have a total light transmittance in the visible light region of preferably 80% or more and an oxygen permeability of 1.00 cc/($m^2 \cdot day \cdot atm$) or less.

The oxygen permeability of the barrier layers 12 and 22 is more preferably 0.1 cc/($m^2 \cdot day \cdot atm$) or less, particularly preferably 0.01 cc/($m^2 \cdot day \cdot atm$) or less, and more particularly preferably 0.001 cc/($m^2 \cdot day \cdot atm$) or less.

A lower oxygen permeability is more preferable, and a higher total light transmittance in the visible light region is more preferable.

The inorganic layer is a layer containing an inorganic material as a main component, and preferably a layer formed from only an inorganic material.

The inorganic layer is preferably a layer having a gas barrier function of blocking oxygen. Specifically, the oxygen permeability of the inorganic layer is preferably 1.00 cc/($m^2 \cdot day \cdot atm$) or less. The oxygen permeability of the inorganic layer can be determined by attaching a wavelength converting layer to a detector of an oxygen concentration meter manufactured by Orbisphere Laboratories, via silicone grease, and then converting the oxygen permeability from the equilibrium oxygen concentration value. It is also preferable that the inorganic layer has a function of blocking water vapor.

Two or three or more inorganic layers may also be included in the barrier layer.

The thickness of the inorganic layer may be 1 to 500 nm, and is preferably 5 to 300 nm and particularly preferably 10 to 150 nm. This is because the film thickness of an adjacent inorganic layer in the above range is capable of suppressing reflection on the inorganic layer while achieving satisfactory barrier properties, whereby a laminated film with higher light transmittance can be provided.

In the substrate film, it is preferable that at least one inorganic layer adjacent to the phosphor-containing layer is included.

The inorganic material constituting the inorganic layer is not particularly limited, and for example, a metal, or various inorganic compounds such as inorganic oxides, nitrides or oxynitrides can be used therefor. For element(s) constituting the inorganic material, silicon, aluminum, magnesium, titanium, tin, indium, and cerium are preferable, and these elements may be included singly or two or more thereof may be included. Specific examples of the inorganic compound include silicon oxide, silicon oxynitride, aluminum oxide, magnesium oxide, titanium oxide, tin oxide, an indium oxide alloy, silicon nitride, aluminum nitride, and titanium nitride. As the inorganic layer, a metal film, for example, an aluminum film, a silver film, a tin film, a chromium film, a nickel film, or a titanium film may also be provided.

It is particularly preferable that the inorganic layer having barrier properties is an inorganic layer containing at least one compound selected from silicon nitride, silicon oxynitride, silicon oxide, or aluminum oxide, among the above-mentioned materials. This is because the inorganic layer formed of such a material is satisfactory in adhesiveness to the organic layer, and therefore, not only, even in the case where the inorganic layer has a pinhole, the organic layer can effectively fill in the pinhole to suppress fracture, but also, even in the case where the inorganic layer is laminated, an extremely satisfactory inorganic layer film can be formed to result in a further enhancement in barrier properties.

The method for forming an inorganic layer is not particularly limited, and for example, a variety of film forming methods capable of evaporating or scattering a film forming material and depositing it on the deposition target surface can be used.

Examples of the method of forming an inorganic layer include a physical vapor deposition method (PVD method) such as a vacuum vapor deposition method of heating an inorganic material such as an inorganic oxide, an inorganic nitride, an inorganic oxynitride, or a metal to cause vapor deposition thereof: an oxidation reaction vapor deposition method of using an inorganic material as a starting material and introducing oxygen gas for oxidation to cause vapor deposition thereof; a sputtering method of using an inorganic material as a target starting material and introducing argon gas or oxygen gas for sputtering to cause vapor deposition; or an ion plating method of causing heating of an inorganic material by a plasma beam generated by a plasma gun to cause vapor deposition; and a plasma chemical vapor deposition method (CVD method) of using an organosilicon compound as a starting material in the case of forming a vapor deposited film of silicon oxide.

The organic layer refers to a layer containing an organic material as a main component, in which the organic material preferably occupies 50% by mass or more, further preferably 80% by mass or more, and particularly preferably 90% by mass or more.

With respect to the organic layer, reference can be made to paragraphs [0020] to [0042] of JP2007-290369A and paragraphs [0074] to [0105] of JP2005-096108A. It is preferable that the organic layer contains a cardo polymer within a range satisfying the above-mentioned adhesion force conditions. This is because adhesiveness to the layer adjacent to the organic layer, in particular, also adhesiveness to the inorganic layer can be thus improved to achieve excellent gas barrier properties. With respect to details of the cardo polymer, reference can be made to paragraphs [0085] to [0095] of JP2005-096108A described above. The film thickness of the organic layer is preferably in the range of 0.05 to 10 μm, inter alia, more preferably in the range of 0.5 to 10 μm. In the case where the organic layer is formed by a wet coating method, the film thickness of the organic layer is preferably in the range of 0.5 to 10 μm, inter alia, preferably in the range of 1 to 5 μm. In the case where the organic layer is formed by a dry coating method, the film thickness of the organic layer is preferably in the range of 0.05 to 5 μm, inter alia, preferably in the range of 0.05 to 1 μm. This is because the film thickness of the organic layer formed by a wet coating method or a dry coating method in the above-specified range is capable of further improving adhesiveness to the inorganic layer.

With respect to other details of the inorganic layer and the organic layer, reference can be made to the descriptions of JP2007-290369A and JP2005-096108A described above and US2012/0113672A1.

In the phosphor-containing film, the organic layer may be laminated as the underlayer of the inorganic layer between the support film and the inorganic layer, and may be laminated as the protective layer of the inorganic layer between the inorganic layer and the phosphor-containing layer. Further, in the case of having two or more inorganic layers, the organic layer may be laminated between the inorganic layers.

(Concavity-Convexity Imparting Layer)

The substrate films 10 and 20 may be provided with a concavity-convexity imparting layer for imparting a concave-convex structure on the surface opposite to the surface on the phosphor-containing layer 30 side. In the case where the substrate films 10 and 20 have a concavity-convexity imparting layer, the blocking property and sliding property of the substrate film can be improved, which is thus preferable. The concavity-convexity imparting layer is preferably a layer containing particles. Examples of the particles include inorganic particles such as silica, alumina, or metal oxide, and organic particles such as crosslinked polymer particles. The concavity-convexity imparting layer is preferably provided on the surface opposite to the phosphor-containing layer of the substrate film, but it may be provided on both surfaces.

The phosphor laminate film can have a light scattering function to efficiently extract the fluorescence of quantum dots to the outside. The light scattering function may be provided inside the phosphor-containing layer 30 or a layer having a light scattering function may be separately provided as the light scattering layer. The light scattering layer may be provided on the surface on the side of the phosphor-containing layer 30 of the substrate films 10 and 20 or may be provided on the surface on the side opposite to the phosphor-containing layer 30 of the substrate films 10 and 20. In the case where the concavity-convexity imparting layer is provided, it is preferable that the concavity-convexity imparting layer is a layer which can also serve as the light scattering layer.

<Production Method of Phosphor-Containing Film>

Next, an example of production steps of the phosphor-containing film according to the embodiment of the present invention configured as described above will be described with reference to FIGS. 11 and 12.

(Coating Liquid Preparation Step)

In the first coating liquid preparation step, a coating liquid for forming a fluorescent region containing quantum dots (or quantum rods) as phosphors is prepared. Specifically, individual components such as quantum dots, a curable compound, a polymer dispersant, a polymerization initiator, and a silane coupling agent dispersed in an organic solvent are mixed in a tank or the like to prepare a coating liquid for forming a fluorescent region. Note that the coating liquid for forming a fluorescent region may not contain an organic solvent.

In the second coating liquid preparation step, a coating liquid for a resin layer to be filled between the fluorescent regions is prepared.

(Resin Layer Forming Step)

Figure 11:
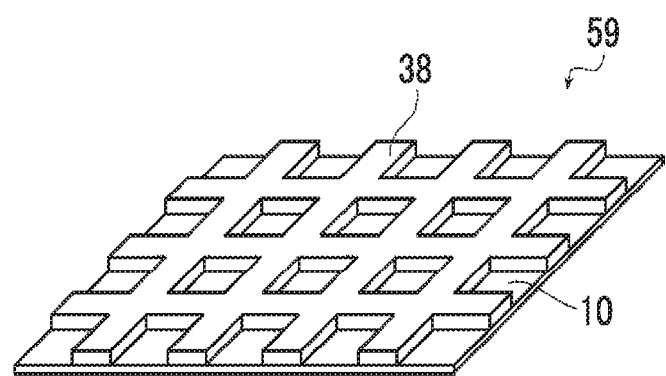
FIG. 11 is a schematic view for explaining a method for producing the phosphor-containing film of the present invention.
Figure 12:
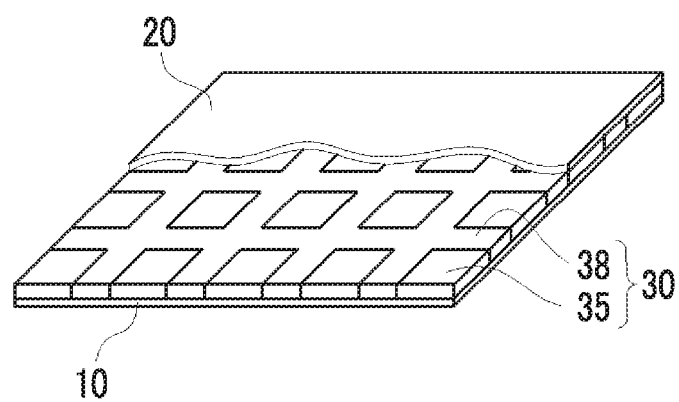
FIG. 12 is a schematic view for explaining the method for producing the phosphor-containing film of the present invention.

Next, a coating liquid for a resin layer is applied onto the first substrate film 10, and a mold having a concavo-convex pattern is pressed against the applied coating liquid for a resin layer to form a predetermined pattern having a concave portion, and the coating liquid for a resin layer is cured to form a laminated film 59 in which the resin layer 38 having a plurality of concave portions is laminated on the first substrate film 10, as shown in FIG. 11.

(Fluorescent Region Forming Step and Second Substrate Film Bonding Step)

Next, the coating liquid for forming a fluorescent region is applied into the concave portion of the resin layer 38 of the laminated film 59, the second substrate film 20 is bonded before curing the coating liquid for forming a fluorescent region, and then the coating liquid for forming a fluorescent region is cured to form a fluorescent region 35 to prepare a phosphor-containing film in which the first substrate film 10, the phosphor-containing layer 30, and the second substrate film 20 are laminated.

With respect to the curing treatment in the fluorescent region forming step and the resin layer forming step, thermal curing, photocuring with ultraviolet rays, or the like may be appropriately selected depending on the coating liquid.

In the case where the resin layer 38 is cured by photocuring with ultraviolet rays, the irradiation amount of ultraviolet rays is preferably 100 to 10000 mJ/cm$^2$.

In the case where the resin layer 38 is cured by thermal curing, it is preferable to heat the resin layer 38 to 20° C. to 100° C.

(Cutting Process)

A continuous (long) phosphor-containing film can be obtained by performing the above steps in a roll-to-roll type apparatus. The obtained phosphor-containing film is cut by a cutting machine as necessary.

Although a method of preparing a phosphor-containing film by an R to R process has been described, the treatment of each step may be carried out in a so-called single wafer type, using a substrate film in the form of a cut sheet.

Further, the above example is configured such that the resin layer 38 is formed and is once wound into a roll shape, and then the fluorescent region 35 or the like is formed, but the present invention is not limited thereto. The preparation of a phosphor-containing film may be configured such that the resin layer 38 is formed and continuously transported, and then the fluorescent region 35 or the like is formed.

Here, in the case where the resin layer forming step is carried out before the fluorescent region forming step, that is, in the case where the resin layer 38 having impermeability to oxygen is formed prior to the fluorescent region, a method of forming a pattern (in particular, a fine convex and concave pattern) using a curable compound for forming the resin layer 38 will be described.

To form a pattern, a so-called photoimprinting method of forming a fine convex and concave pattern through a step of applying a curable compound forming a resin layer 38 having impermeability to oxygen onto a substrate or a support (base material), a step of pressing a mold against the surface of the coating layer, a step of irradiating the curable compound with light, and a step of peeling a mold can be used.

Here, the curable compound forming the resin layer 38 having impermeability to oxygen may be poured between the base material and the mold, and then photo-cured while pressing the mold under pressure. Further, the curable compound may be further heated and cured after photo-irradiation. Such photoimprint lithography is also capable of achieving lamination or multiple patterning and may be used in combination with thermal imprinting. The pattern formation can also be carried out by an inkjet method or a dispenser method.

Hereinafter, the convex and concave pattern forming method (pattern transfer method) will be specifically described.

First, a curable compound is applied onto a base material. The methods of applying a curable compound onto the base material include commonly well-known application methods such as dip coating, air knife coating, curtain coating, wire bar coating, gravure coating, extrusion coating, spin coating, slit scanning, casting, and ink jet methods, by which a coated film or liquid droplets may be applied onto the base material. The curable compound forming the resin layer 38 having impermeability to oxygen is suitable for a gravure coating method and a casting method. The film thickness of the pattern forming layer (coating layer for forming a pattern) formed of the curable compound varies depending on the application to be used, but it is about 1 to 150 µm. Alternatively, the curable compound may be coated by multiple coating. Further, another organic layer such as a planarizing layer may be formed between the base material and the pattern forming layer. The pattern forming layer and the substrate are therefore not brought into direct contact with each other, so that the substrate may be prevented from adhesion of dust, damage, and the like.

The base material (substrate or support) for applying a curable compound is selectable depending on various applications, and examples thereof include, but are not particularly limited to, quartz, glass, optical film, ceramic material, vapor deposited film, magnetic film, reflective film, metal substrate made of Ni, Cu, Cr, Fe or the like, paper, Spin On Glass (SOG), polymer substrates such as polyester film, polycarbonate film, or polyimide film, thin film transistor (TFT) array substrate, electrode plate of plasma display panel (PDP), glass or transparent plastic substrate, electroconductive base material made of indium tin oxide (ITO), metal, or the like, insulating base material, and semiconductor manufacturing substrate made of silicon, silicon nitride, polysilicon, silicon oxide, amorphous silicon, or the like. The shape of the base material is also not particularly limited, and may be any of a plate-like substrate or a roll-like substrate. Further, as described below, the base material may be selected from light-transmissive and non-light-transmissive ones, depending on a combination with a mold or the like.

Next, in order to transfer the pattern to the pattern forming layer, the mold is pressed onto the surface of the pattern forming layer. In this way, a fine pattern preliminarily formed on the surface, to be pressed, of the mold may be transferred to the pattern forming layer. Alternatively, a curable compound may be applied onto a mold having a pattern formed thereon, and the substrate may be pressed thereto. For photoimprint lithography, a light-transmissive material is selected for at least one of the molding material and/or the base material. In the photoimprint lithography, a curable compound is applied onto a base material to form a pattern forming layer thereon, and a light-transmissive mold is pressed against the surface of the pattern forming layer, then this is irradiated with light from the back of the mold, and the curable compound is thereby cured. Alternatively, a curable compound is applied onto a light-transmissive base material, then a mold is pressed against the surface of the coating layer, and this is irradiated with light from the back of the base material whereby the curable compound can be cured.

The photo-irradiation may be carried out in a state in which the mold is attached or after the mold is released, but it is preferable to perform photo-irradiation in a state where the mold is closely attached.

The mold usable herein is a mold having formed thereon a pattern to be transferred. The pattern on the mold may be formed according to desired processing accuracy, for example, by photolithography, electron beam lithography, or the like, but the method of forming a mold pattern is not particularly limited.

The light-transmissive molding material is not particularly limited, but any material having predetermined strength and durability may be used. Specific examples thereof include glass, quartz, a light-transparent resin such as PMMA or polycarbonate resin, a transparent metal vapor-deposited film, a flexible film made of polydimethylsiloxane or the like, a photocured film, and a metal film such as SUS.

On the other hand, the non-light-transmissive molding material used in the case of using a light-transmissive base material is not particularly limited, but any material having a predetermined strength may be used. Specific examples of the molding material include a ceramic material, a vapor deposited film, a magnetic film, a reflective film, a metal substrate such as Ni, Cu, Cr, Fe or the like, and a substrate of SiC, silicon, silicon nitride, polysilicon, silicon oxide, amorphous silicon or the like. Further, the shape of the mold is not particularly limited, either a plate-like mold or a roll-like mold may be used. The roll-like mold is applied particularly in the case where continuous productivity of transfer is required.

A mold may be used which has been subjected to a surface release treatment in order to improve releasability between the curable compound and the mold surface. As such a mold, those treated with a silane coupling agent such as a silicone-based silane coupling agent or a fluorine-based silane coupling agent, for example, commercially available releasing agents such as OPTOOL DSX (manufactured by Daikin Industries, Ltd.) and Novec EGC-1720 (manufactured by Sumitomo 3M Ltd.) can also be suitably used.

In the case where such photoimprint lithography is carried out, it is usually preferable to carry out the lithography at a mold pressure of 10 atm or less. In the case where the mold pressure is set to 10 atm or less, the mold and the substrate are hardly deformed and the pattern accuracy tends to improve. In addition, it is preferable from the viewpoint that the pressure unit may be small-sized since the pressure to be given to the mold may be low. Regarding the mold pressure, it is preferable to select a region where uniformity of mold transfer can be secured within the range where the residual film of the curable compound in the area of mold pattern projections is reduced.

The irradiation dose of photo-irradiation in the step of irradiating the pattern forming layer with light may be sufficiently larger than the irradiation dose necessary for curing. The irradiation dose necessary for curing is appropriately determined by examining the consumption amount of unsaturated bonds of the curable composition and the tackiness of the cured film.

In the photoimprint lithography, photo-irradiation is carried out while keeping the substrate temperature generally at room temperature, in which the photo-irradiation may alternatively be conducted under heating for the purpose of enhancing the reactivity. The photo-irradiation may be carried out in vacuo, since a vacuum conditioning prior to the photo-irradiation is effective for preventing entrainment of bubbles, suppressing the reactivity from being reduced due to incorporation of oxygen, and for improving the adhesiveness between the mold and the curable composition. In the pattern forming method, the degree of vacuum at the time of photo-irradiation is preferably in the range of $10^{-1}$ Pa to 1 atmosphere.

The light used for curing the curable compound is not particularly limited, and examples thereof include light and radiation having a wavelength falling within a range of high-energy ionizing radiation, near ultraviolet light, far ultraviolet light, visible light, infrared light, and the like. The high-energy ionizing radiation source includes, for example, accelerators such as a Cockcroft accelerator, a Van de Graaff accelerator, a linear accelerator, a betatron, and a cyclotron. The electron beams accelerated by such an accelerator are used industrially most conveniently and economically; but any other radioisotopes and other radiations from nuclear reactors, such as γ-rays, X-rays, α-rays, neutron beams, and proton beams may also be used. Examples of the ultraviolet ray source include an ultraviolet fluorescent lamp, a low-pressure mercury lamp, a high-pressure mercury lamp, an ultra-high-pressure mercury lamp, a xenon lamp, a carbon arc lamp, a solar lamp, and a light emitting diode (LED). Examples of the radiation include microwaves and extreme ultraviolet (EUV). In addition, laser light used in microfabrication of semiconductors, such as LED, semiconductor laser light, 248 nm KrF excimer laser light, and 193 nm ArF excimer laser light, can also be suitably used in the present invention. These light rays may be monochromatic light, or may also be a plurality of light rays of different wavelengths (mixed light).

Upon exposure, the exposure illuminance is preferably within a range of 1 mW/cm² to 50 mW/cm². In the case where the exposure illuminance is set to 1 mW/cm² or more, then the productivity may increase since the exposure time may be reduced; and in the case where the exposure illuminance is set to 50 mW/cm² or less, then it is preferable since the properties of a permanent film may be prevented from being degraded owing to side reactions. The exposure dose is preferably in the range of 5 mJ/cm² to 1,000 mJ/cm². In the case where the exposure dose is less than 5 mJ/cm², the exposure margin becomes narrow and the photocuring becomes insufficient so that problems such as adhesion of unreacted materials to the mold are liable to occur. On the other hand, in the case where the exposure dose is more than 1,000 mJ/cm², there is a risk of deterioration of the permanent film due to decomposition of the composition. Further, at the time of exposure, in order to prevent inhibition of radical polymerization by oxygen, an inert gas such as nitrogen or argon may be flowed to control the oxygen concentration to be less than 100 mg/L.

In the pattern forming method, after the pattern forming layer is cured through photo-irradiation, a step of further curing the cured pattern by applying heat thereto may be included as necessary. The temperature of heat for heating and curing the composition of the present invention after photo-irradiation is preferably 150° C. to 280° C. and more preferably 200° C. to 250° C. The heating time is preferably 5 to 60 minutes and more preferably 15 to 45 minutes.

The pattern to be formed may take an arbitrary form. For example, there is a grid-like mesh pattern in which a concave or convex portion is of a regular tetragon, a honeycomb pattern in which a concave or convex portion is of a regular hexagon, or a sea island pattern in which a concave or convex portion is circular. A honeycomb pattern having a phosphor-containing layer in a regular hexagonal portion and a resin layer in a peripheral portion is particularly preferable from the viewpoint of effectively blocking penetration of oxygen into a phosphor layer with respect to an arbitrary cutting form of the present invention.

"Backlight Unit"

Figure 13:
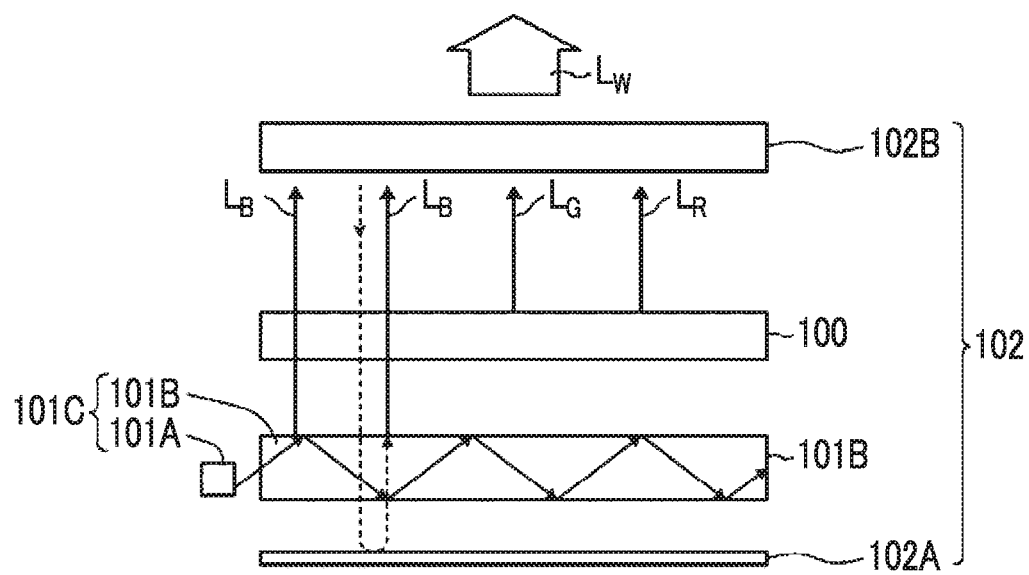
FIG. 13 is a cross-sectional view of a schematic configuration of a backlight unit comprising the phosphor-containing film as a wavelength converting member.

With reference to the drawings, a description will be given of a backlight unit comprising a wavelength converting member as one embodiment of the phosphor-containing film of the present invention. FIG. 13 is a schematic diagram showing a schematic configuration of a backlight unit.

As shown in FIG. 13, the backlight unit 102 comprises a planar light source 101C including a light source 101A that emits primary light (blue light La) and a light guide plate 101B that guides and emits primary light emitted from the light source 101A, a wavelength converting member 100 made of a phosphor-containing film provided on the planar light source 101C, a reflecting plate 102A disposed opposite to the wavelength converting member 100 with the planar light source 101C interposed therebetween, and a retroreflective member 102B. In FIG. 13, the reflecting plate 102A, the light guide plate 101B, the wavelength converting member 100, and the retroreflective member 102B are separated from each other, but in reality these may be formed in intimate attachment with each other.

The wavelength converting member 100 emits fluorescence by using at least a part of the primary light $L_B$ emitted from the planar light source 101C as excitation light and emits the secondary light (green light $L_G$ and red light $L_R$) composed of this fluorescence and the primary light $L_B$ transmitted through the wavelength converting member 100. For example, the wavelength converting member 100 is a phosphor-containing film which is constituted such that the phosphor-containing layers including the quantum dots that emit the green light $L_G$ and the quantum dots that emit the red light $L_R$ upon irradiation with the blue light $L_B$ are sandwiched between the first substrate film and the second substrate film.

In FIG. 13, $L_B$, $L_G$, and $L_R$ emitted from the wavelength converting member 100 are incident on the retroreflective member 102B, and each incident light repeats reflection between the retroreflective member 102B and the reflecting plate 102A and passes through the wavelength converting member 100 many times. As a result, in the wavelength converting member 100, a sufficient amount of excitation light (blue light $L_B$) is absorbed by the phosphors 31 (in this case, quantum dots) in the phosphor-containing layer 30 and a necessary amount of fluorescence ($L_G$ and $L_R$) is emitted, and the white light $L_W$ is embodied from the retroreflective member 102B and is emitted.

From the viewpoint of realizing high luminance and high color reproducibility, it is preferable to use, as the backlight unit, one formed into a multi-wavelength light source. For example, preferred is a backlight unit which emits blue light having a luminescence center wavelength in the wavelength range of 430 to 480 nm and having a luminescence intensity peak with a half-width of 100 nm or less, green light having a luminescence center wavelength in the wavelength range of 500 to 600 nm and having a luminescence intensity peak with a half-width of 100 nm or less, and red light having a luminescence center wavelength in the wavelength range of 600 nm to 680 nm and having a luminescence intensity peak with a half-width of 100 nm or less.

From the viewpoint of further improving luminance and color reproducibility, the wavelength range of the blue light emitted from the backlight unit is more preferably 440 nm to 460 nm.

From the same viewpoint, the wavelength range of the green light emitted from the backlight unit is preferably 520 nm to 560 nm and more preferably 520 nm to 545 nm. In addition, from the same viewpoint, the wavelength range of the red light emitted from the backlight unit is more preferably 610 nm to 650 nm.

In addition, from the same viewpoint, all the half-widths of the respective luminescence intensities of the blue light, the green light, and the red light emitted from the backlight unit are preferably 80 nm or less, more preferably 50 nm or less, further preferably 40 nm or less, still more preferably 30 nm or less. Among them, the half-width of the luminescence intensity of the blue light is particularly preferably 25 nm or less.

In the above description, the light source 101A is, for example, a blue light emitting diode that emits blue light having a luminescence center wavelength in the wavelength range of 430 nm to 480 nm, but an ultraviolet light emitting diode that emits ultraviolet light may be used. An ultraviolet light emitting diode is a light emitting diode having a light emission center in a wavelength range of 350 nm to 400 nm, for example. As the light source 101A, a laser light source or the like may be used in addition to light emitting diodes. In the case where a light source that emits ultraviolet light is provided, the wavelength converting layer (phosphor-containing layer) of the wavelength converting member may include a phosphor that emits blue light, a phosphor that emits green light, and a phosphor that emits red light, upon irradiation with ultraviolet light.

As shown in FIG. 13, the planar light source 101C may be a planar light source formed of the light source 101A, and the light guide plate 101B which guides the primary light exiting from the light source 101A and allows the guided primary light to exit, or may be a planar light source in which the light source 101A and the wavelength converting member 100 are disposed parallel to each other on the plane, and a diffusion plate is provided in place of the light guide plate 101B. The former planar light source is generally referred to as an edge light mode backlight unit, and the latter planar light source is generally referred to as a direct backlight mode backlight unit.

In the present embodiment, the case where a planar light source is used as a light source has been described as an example, but a light source other than the planar light source may also be used as the light source.

(Configuration of Backlight Unit)

In FIG. 13, an edge light mode backlight unit including a light guide plate, a reflecting plate, and the like as constituent members has been illustrated as the configuration of the backlight unit, but the backlight unit may be a direct backlight mode backlight unit. A known light guide plate can be used without any limitation as the light guide plate.

In addition, the reflecting plate 102A is not particularly limited, and known reflecting plates can be used, which are described in JP3416302B, JP3363565B, JP4091978B, and JP3448626B, and the like, the contents of which are incorporated by reference herein in their entirety.

The retroreflective member 102B may be configured of a known diffusion plate or a known diffusion sheet, a known prism sheet (for example, BEF series manufactured by Sumitomo 3M Limited), a known light guide device, and the like. The configuration of the retroreflective member 102B is described in JP3416302B, JP3363565B, JP4091978B, JP3448626B, and the like, the contents of which are incorporated by reference herein in their entirety.

"Liquid Crystal Display"

Figure 14:
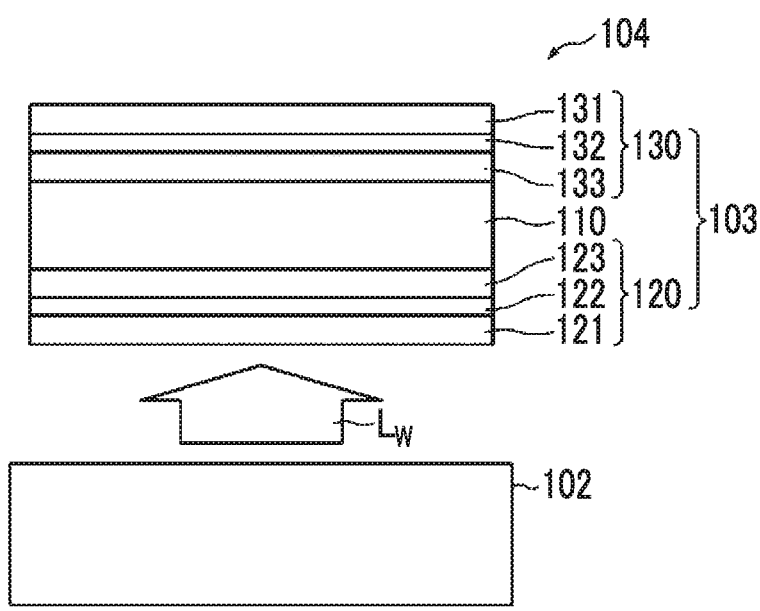
FIG. 14 is a cross-sectional view of a schematic configuration of a liquid crystal display comprising the backlight unit.

The backlight unit 102 described above can be applied to a liquid crystal display. As shown in FIG. 14, a liquid crystal display 104 comprises the backlight unit 102 of the above-described embodiment, and a liquid crystal cell unit 103 disposed opposite to the retroreflective member side of the backlight unit.

As shown in FIG. 14, the liquid crystal cell unit 103 has a configuration in which a liquid crystal cell 110 is sandwiched between polarizing plates 120 and 130, and the polarizing plates 120 and 130 are configured such that both main surfaces of polarizers 122 and 132 are protected by polarizing plate protective films 121 and 123, and 131 and 133, respectively.

The liquid crystal cell 110 and the polarizing plates 120 and 130 constituting the liquid crystal display 104 and the constituents thereof are not particularly limited, and members prepared by a known method or commercially available products can be used without any limitation. In addition, it is also possible, of course, to provide a known intermediate layer such as an adhesive layer between the respective layers.

A driving mode of the liquid crystal cell 110 is not particularly limited, and various modes such as a twisted nematic (TN) mode, a super twisted nematic (STN) mode, a vertical alignment (VA) mode, an in-plane switching (IPS) mode, and an optically compensated bend cell (OCB) mode can be used. The driving mode of the liquid crystal cell is preferably a VA mode, an OCB mode, an IPS mode, or a TN mode, but it is not limited thereto. An example of the configuration of the liquid crystal display in the VA mode may be the configuration illustrated in FIG. 2 of JP2008-262161A. Here, a specific configuration of the liquid crystal display is not particularly limited, and a known configuration can be adopted.

Further, as necessary, the liquid crystal display 104 includes a subsidiary functional layer such as an optical compensation member performing optical compensation or an adhesive layer. In addition, a surface layer such as a forward scattering layer, a primer layer, an antistatic layer, or an undercoat layer may be disposed along with (or in place of) a color filter substrate, a thin layer transistor substrate, a lens film, a diffusion sheet, a hard coat layer, an antireflection layer, a low reflective layer, an antiglare layer, or the like.

The backlight side polarizing plate 120 may include a phase difference film as a polarizing plate protective film 123 on the liquid crystal cell 110 side. A known cellulose acylate film or the like can be used as such a phase difference film.

The backlight unit 102 and the liquid crystal display 104 are provided with the wavelength converting member made of the phosphor-containing film according to the embodiment of the present invention described above in which oxygen deterioration is suppressed. Accordingly, the same effect as that of the above-mentioned phosphor-containing film according to the embodiment of the present invention can be obtained, and a high-luminance backlight unit and a high-luminance liquid crystal display, in which the luminescence intensity of the wavelength converting layer containing quantum dots is hardly lowered, are obtained.

EXAMPLES

Hereinafter, the present invention will be more specifically described with reference to Examples. The materials, use amounts, proportions, treatment contents, treatment procedures, and the like shown in the following Examples can be appropriately modified without departing from the spirit of the present invention. Therefore, the scope of the present invention should not be construed as being limited to the following specific Examples.

Example 1

<Preparation of Phosphor-Containing Film>

A phosphor-containing film having a phosphor-containing layer was prepared using a coating liquid containing quantum dots as a phosphor.

(Substrate Film)

As a first substrate film and a second substrate film, a substrate film was prepared in which a barrier layer made of an inorganic layer was formed on a support film made of polyethylene terephthalate (PET), and an organic layer coated with the following composition was formed on the barrier layer. The material for forming the inorganic layer was silicon nitride ($Si_3N_4$), and the thickness thereof was 30 nm. In the case where the oxygen permeability of the substrate film was measured using OX-TRAN 2/20 (manufactured by MOCON Inc.), it showed a value of $4.0 \times 10^3$ cc/($m^2 \cdot day \cdot atm$) or less.

| ((Composition for substrate film organic layer)) | |
| --- | --- |
| Urethane acrylate (ACRIT 8BR-500, manufactured by Taisei Fine Chemical Co., Ltd.) | 30 parts by mass |
| Photopolymerization initiator (IRGACURE 184, manufactured by BASF Corporation) | 3 parts by mass |
| Methyl isobutyl ketone | 67 parts by mass |

The above composition was coated on the barrier layer of the support film to a thickness of 1 μm and then dried at 60° C. for 1 minute. Using an air-cooled metal halide lamp (manufactured by Eye Graphics Co., Ltd.) at 200 W/cm, ultraviolet rays at a dose of 400 mJ/$cm^2$ were irradiated from the coated surface to cure the dried film, thus forming an organic layer.

(Preparation of Phosphor-Containing Layer)

As a coating liquid 1 for forming a phosphor-containing layer, individual components such as a quantum dot, a curable compound, a thixotropic agent, a polymerization initiator, and a silane coupling agent were mixed in a tank or the like to prepare a coating liquid.

| <Composition of coating liquid 1 of phosphor-containing layer> A quantum dot dispersion liquid having the following composition was prepared and used as coating liquid 1. | |
| --- | --- |
| Toluene dispersion liquid of quantum dots 1 (emission maximum: 520 nm) | 10 parts by mass |
| Toluene dispersion liquid of quantum dots 2 (emission maximum: 630 nm) | 1 part by mass |
| Lauryl methacrylate | 2.4 parts by mass |
| Trimethylolpropane triacrylate | 0.54 parts by mass |
| Photopolymerization initiator (IRGACURE 819, manufactured by BASF Corporation) | 0.009 parts by mass |

For the quantum dots 1 and 2, nanocrystals having the following core-shell structure (InP/ZnS) were used.
Quantum dots 1: INP 530-10 (manufactured by NN-Labs, LLC)
Quantum dots 2: INP 620-10 (manufactured by NN-Labs, LLC)

| <Composition of coating liquid for forming resin layer> A coating liquid for forming a resin layer having the following composition was prepared to obtain a coating liquid 2. | |
| --- | --- |
| Urethane (meth)acrylate (U-4HA, manufactured by Shin-Nakamura Chemical Co., Ltd.) | 49 parts by mass |
| Tricyclodecanedimethanol diacrylate (A-DCP, manufactured by Shin-Nakamura Chemical Co., Ltd.) | 25 parts by mass |
| 1,6-hexanediol diacrylate (LIGHT ACRYLATE 1.6HX-A, manufactured by Kyoeisha Chemical Co., Ltd.) | 25 parts by mass |
| Photopolymerization initiator (IRGACURE 819, manufactured by BASF Corporation) | 1 part by mass |

(Resin Layer Forming Step)

A resin layer was formed on the first substrate film by the following photoimprinting method. First, using a dispenser, the coating liquid 2 for forming a resin layer was poured into a space between an SUS mold having a honeycomb-like pattern (in which a line width of a concave portion is 0.5 mm, a diagonal line of a convex portion regular hexagon is 1 mm, and a concave portion depth is 50 μm) prepared by a photo etching method and the organic layer side of the first substrate film, followed by pressing thereagainst with a rubber roller at a pressure of 0.3 MPa so as to discharge an excess coating liquid, so that the mold filled with the coating liquid was laminated on the first substrate film. Subsequently, using an air-cooled metal halide lamp (manufactured by Eye Graphics Co., Ltd.) at 200 W/cm, ultraviolet rays at a dose of 500 mJ/$cm^2$ were irradiated from the side of the first substrate film to cure the film at room temperature of 25° C., and the mold was then released to obtain a first substrate film on which a resin layer was formed.

(Phosphor Composition Filling Step)

A phosphor layer-containing film filled between the resin layers on the first substrate film and laminated with the second substrate film was prepared according to the following procedure. First, using a dispenser, the coating liquid 1 of the phosphor-containing layer was poured into a space between the resin layer side of the first substrate film on which the resin layer prepared in the above step was formed and the organic layer side of the second substrate film, followed by pressing thereagainst with a rubber roller at a pressure of 0.3 MPa so as to discharge an excess coating liquid, so that the coating liquid of the phosphor-containing layer was filled between the first substrate film, the resin layer, and the second substrate film. Subsequently, using an air-cooled metal halide lamp (manufactured by Eye Graphics Co., Ltd.) at 200 W/cm, ultraviolet rays were irradiated from the side of the first substrate film at a dose of 2500 mJ/cm² to cure the film at room temperature of 25° C., thus preparing a phosphor-containing film. The obtained phosphor-containing film had a resin layer width of 0.5 mm, a phosphor layer width of 1 mm, and a film thickness of each of a resin layer and a phosphor layer of 50 μm.

Example 2

A phosphor-containing film was prepared in the same manner as in Example 1, except that the composition described below was used as the coating liquid for forming a resin layer.

<Composition of coating liquid 3 for forming resin layer>

| | |
|---|---|
| 1,6 hexanediol diacrylate (LIGHT ACRYLATE 1.6HA-A, manufactured by Kyoeisha Chemical Co., Ltd.) | 99 parts by mass |
| Photopolymerization initiator (IRGACURE 819, manufactured by BASF Corporation) | 1 part by mass |

Comparative Example 1

A phosphor-containing film was prepared in the same manner as in Example 1, except that the composition described below was used as the coating liquid for forming a resin layer.

<Composition of coating liquid 4 for forming resin layer>

| | |
|---|---|
| 1,9-nonanediol diacrylate (1,9ND-A, manufactured by Kyoeisha Chemical Co., Ltd.) | 99 parts by mass |
| Photopolymerization initiator (IRGACURE 819, manufactured by BASF Corporation) | 1 part by mass |

1,9ND-A

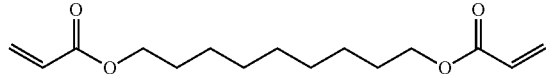 [SMILES: C=CC(=O)OCCCCCCCCCOC(=O)C=C]

Comparative Example 2

A phosphor-containing film was prepared in the same manner as in Example 1, except that the composition described below was used as the coating liquid for forming a resin layer.

<Composition of coating liquid 4 for forming resin layer>

| | |
|---|---|
| Dipentaerythritol hexaacrylate (DPHA, manufactured by Daicel-Cytec Co., Ltd.) | 99 parts by mass |
| Photopolymerization initiator (IRGACURE 2022, manufactured by BASF Corporation) | 1 part by mass |

DPHA

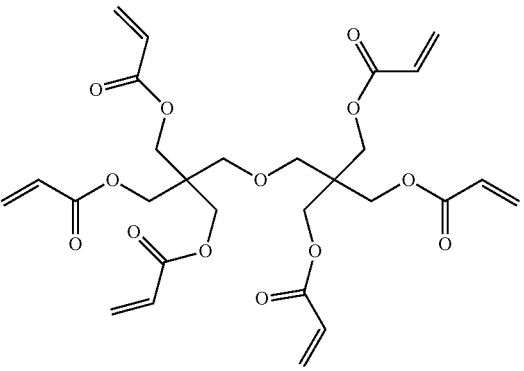 [SMILES: C=CC(=O)OCC(COCC(COC(=O)C=C)(COC(=O)C=C)COC(=O)C=C)(COC(=O)C=C)COC(=O)C=C]

Example 3

A phosphor-containing film was prepared in the same manner as in Example 1, except that the composition described below was used as the coating liquid for forming a resin layer.

<Composition of coating liquid 5 for forming resin layer>

| | |
|---|---|
| Urethane (meth)acrylate (U-4HA, manufactured by Shin-Nakamura Chemical Co., Ltd.) | 48 parts by mass |
| Epoxy methacrylate (CYCLOMER M100, manufactured by Daicel Chemical Industries, Ltd.) | 25 parts by mass |
| Tricyclodecanedimethanol diacrylate (A-DCP, manufactured by Shin-Nakamura Chemical Co., Ltd.) | 25 parts by mass |
| Photopolymerization initiator (IRGACURE 819, manufactured by BASF Corporation) | 1 part by mass |
| Photopolymerization initiator (CPI-100P, manufactured by San-Apro Ltd.) | 1 part by mass |

Cyclomer M100

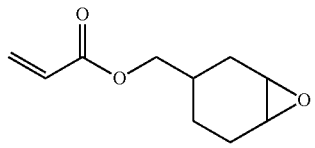

Comparative Example 3

A phosphor-containing film was prepared in the same manner as in Example 1, except that the composition described below was used as the coating liquid for forming a resin layer.

<Composition of coating liquid 6 for forming resin layer>

| | |
|---|---|
| Tricyclodecanedimethanol diacrylate (A-DCP, manufactured by Shin-Nakamura Chemical Co., Ltd.) | 99 parts by mass |
| Photopolymerization initiator (IRGACURE 819, manufactured by BASF Corporation) | 1 part by mass |

Example 4

A phosphor-containing film was prepared in the same manner as in Example 1, except that the composition described below was used as the coating liquid for forming a resin layer.

| <Composition of coating liquid 8 for forming resin layer> | |
| --- | --- |
| Urethane (meth)acrylate (U-4HA, manufactured by Shin-Nakamura Chemical Co., Ltd.) | 99 parts by mass |
| Photopolymerization initiator (IRGACURE 2022, manufactured by BASF Corporation) | 1 part by mass |

Comparative Example 4

A phosphor-containing film was prepared in the same manner as in Example 1, except that the composition described below was used as the coating liquid for forming a resin layer.

| <Composition of coating liquid 7 for forming resin layer> | |
| --- | --- |
| Trimethylolpropane triacrylate (A-TMPT, manufactured by Shin-Nakamura Chemical Co., Ltd.) | 99 parts by mass |
| Photopolymerization initiator (IRGACURE 819, manufactured by BASF Corporation) | 1 part by mass |

Example 5

A phosphor-containing film was prepared in the same manner as in Example 1, except that the total irradiation dose of ultraviolet rays in the case of curing the resin layer was set to 50,000 ml/cm².

Example 6

A phosphor-containing film was prepared in the same manner as in Example 1, except that the total irradiation dose of ultraviolet rays in the case of curing the resin layer was set to 500 mJ/cm².

Example 7

A phosphor-containing film was prepared in the same manner as in Example 1, except that KURARISTER CI (manufactured by Kuraray Co., Ltd.) was used as the first substrate film and the second substrate film. In the case where the oxygen permeability of the substrate film was measured using OX-TRAN 2/20 (manufactured by MOCON Inc.), it showed a value of $1.0 \times 10^{-1}$ cc/(m²·day·atm) or less.

<Measurement of Knoop Hardness, Creep Recovery Rate, and Elastic Recovery Rate of Resin Layer>

The Knoop hardness, creep recovery rate, and elastic recovery rate of the resin layer of the phosphor-containing film prepared in each Example and Comparative Example were respectively measured in the following manner.

(Knoop Hardness)

Samples similar to the resin layer of the phosphor-containing film prepared in each Example and Comparative Example were prepared. Using a PICODENTOR HM500p type hardness tester manufactured by Fischer Instruments K.K., the surface of a sample fixed to a glass substrate was measured with a Knoop indenter under the conditions of a load time of 10 sec, a creep time under a maximum load of 5 sec, an unloading time of 10 sec, a creep time after unloading of 5 see, and a maximum load of 20 mN. The hardness was calculated from the relationship between the indenter-sample contact area obtained from the indentation depth and the maximum load, and the average value of values at 10 points was taken as the Knoop hardness.

(Creep Recovery Rate) Using a PICODENTOR HM500p type hardness tester manufactured by Fischer Instruments K.K., the surface of a sample fixed to a glass substrate was measured with a Knoop indenter under the conditions of a load time of 10 sec, a creep time under a maximum load of 5 sec, an unloading time of 10 sec, a creep time after unloading of 5 see, and a maximum load of 20 mN. The ratio of creep recovery was calculated from the relationship between the indentation depth immediately after unloading and the depth after 5 seconds of unloading, and the average value of values at 10 points was taken as the creep recovery rate.

(Elastic Recovery Rate)

Using a PICODENTOR HM500p type hardness tester manufactured by Fischer Instruments K.K., the surface of a sample fixed to a glass substrate is measured with a Knoop indenter under the conditions of a load time of 10 sec, a creep time under a maximum load of 5 sec, an unloading time of 10 sec, a creep time after unloading of 5 sec, and a maximum load of 20 mN. The ratio of elastic recovery is calculated from the relationship between the area surrounded by three points of [indentation depth after creep time, maximum load], [indentation depth after creep time, zero load], and [indentation depth immediately after unloading, zero load] (corresponding to elastic deformation energy E released at unloading), and the area surrounded by four points of the origin, [indentation depth before creep time, maximum load], [indentation depth after creep time, maximum load], and [indentation depth after creep time, zero load] (corresponding to the total energy E required for load (and creep)), on the graph obtained by plotting the horizontal axis as an indentation depth and the vertical axis as a load, and the average value of values at 10 points is taken as the elastic recovery rate.

<Measurement of Water Vapor Permeability and Oxygen Permeability of Resin Layer>

The water vapor permeability and moisture content of the resin layer of the phosphor-containing film prepared in each Example and Comparative Example were measured using samples of the resin layer in the following manner.

(Water Vapor Permeability)

The water vapor permeability was measured by a calcium corrosion method (method described in JP2005-283561A). The conditions of the constant temperature and humidity treatment were a temperature of 40° C. and a relative humidity of 90% RH.

(Oxygen Permeability)

With respect to oxygen permeability, fm/(s·Pa) can be used as the SI unit. It is possible to carry out conversion of units as a relationship of 1 fm/(s·Pa)=8.752 cc/(m²·day·atm). fm is read as femtometer and 1 fm=$10^{-15}$ m.

The oxygen permeability here is a value measured using an oxygen gas permeability measuring apparatus (OX-TRAN 2/20, trade name, manufactured by MOCON Inc.) under conditions of a measurement temperature of 23° C. and a relative humidity of 90%.

<Evaluation Items>

The phosphor-containing films prepared in Examples and Comparative Examples were wavelength converting members, and changes over time in the luminescence performance of these wavelength converting members were measured and evaluated as follows.

(Initial Luminance)

The initial luminance (Y) of the wavelength converting member of each Example and Comparative Example was measured according to the following procedure.

First, each wavelength converting member was cut into a square of 1 in$^2$ using a THOMSON BLADE MIR-CI23 (manufactured by Nakayama Corporation). Each side of the cut wavelength converting member straddles the resin layer and the fluorescent region.

On the other hand, a backlight unit was taken out by disassembling a commercially available tablet terminal (Kindle (registered trademark) Fire HDX 7", manufactured by Amazon). After removing the wavelength converting member attached to the backlight unit taken out, the phosphor-containing film prepared as described above was placed on the light guide plate, and two prism sheets whose orientations were orthogonal to each other were laid thereon. Among the luminances of the light emitted from a blue light source and transmitted through the phosphor-containing film and the two prism sheets, the luminance at the position 1 mm inwards from the cut surface (however, a fluorescent region other than the fluorescent region positioned on the cut surface) was measured with a luminance meter (SR3, manufactured by Topcon Corporation) set at a position 740 mm apart in the direction perpendicular to the plane of the light guide plate, and the obtained value was taken as initial luminance (Y).

The evaluation standards for the initial luminance (Y) are as follows. In the case where the evaluation result was B or higher, it can be determined that the luminance efficiency was maintained satisfactorily.

AA; 14000[cd/m$^2$]<Y
A; 12000[cd/m$^2$]<Y≤14000[cd/m$^2$]
B; 10000[cd/m$^2$]<Y≤12000[cd/m$^2$]
C; 8000[cd/m$^2$]<Y≤10000[cd/m$^2$]
D; 8000[cd/m$^2$]≤Y (Evaluation of Edge Deterioration)

Next, each wavelength converting member was placed on a commercially available blue light source (OPSM-H150X142B, manufactured by OPTEX-FA Co., Ltd.) in a room kept at 85° C., and the wavelength converting member was continuously irradiated with blue light for 2,000 hours. After 1,000 hours and 2,000 hours, the wavelength converting member was taken out and the luminance thereof was measured according to the same procedure as above. The luminance at high temperature test 1,000 hours and the luminance at high temperature test 2,000 hours were measured, respectively. Assuming that the luminance after the test is Y', the change rate (α) of the luminance (Y') after the test relative to the initial luminance value (Y) was calculated according to the following expression and evaluated as an index of luminance change according to the following standards.

$\alpha = Y'/Y$

In the case where the evaluation results were A and B, it can be determined that the luminance efficiency was maintained satisfactorily. Note that the evaluation result C was practically acceptable, but the evaluation result D was unacceptable. Evaluation standards for the change rate of the luminance after the test relative to the initial luminance value were the same also in the following deterioration evaluation.

A; 0.95<α
B; 0.7<α≤0.95
C; 0.5<α≤0.7
D; 0.5≥α

In Comparative Example 2 and Comparative Example 4, evaluation of edge deterioration was not carried out since the cut remainder appears.

(Evaluation of Luminance Unevenness)

The wavelength converting member of each of Examples and Comparative Examples cut into 50 mm$^2$ using a THOMSON BLADE MIR-CI 23 (manufactured by Nakayama Corporation) and two prism sheets mounted on a commercially available tablet terminal (Kindle (registered trademark) Fire HIDX 7", manufactured by Amazon) were placed on a commercially available blue light source (OPSM-H150X142B, manufactured by OPTEX-FA Co., Ltd.) and the state irradiated with blue light was imaged with a single lens reflex digital camera (D-7200, manufactured by Nikon Corporation). In the range of 40 mm$^2$ from the sample center of the obtained image, the average value (G) of Gray values and the standard deviation σ were obtained and evaluated according to the following standards. In the case where the evaluation results were A and B, it can be determined that the luminance unevenness was satisfactory. Note that the evaluation result C was practically acceptable, but the evaluation result D was unacceptable.

A: 0%≤σ/G<3%
B: 3%≤σ/G<10%
C: 10%≤σ/G<20%
D: 20%≥σ/G (Evaluation of Cut Surface)

Each wavelength converting member was cut into a square of 1 in$^2$ using a THOMSON BLADE MIR-CI 23 (manufactured by Nakayama Corporation), and four sides of a square at the end face were imaged by an optical microscope DS-Ri2 (manufactured by Nikon Corporation) and evaluated according to the following standards.

A: No cracking on septum and no face collapse
B: Cracks generated on septum even in one of four sides
C: Face collapse even in one of four sides (Evaluation of Cut Remainder)

Each wavelength converting member was cut into a square of 1 in$^2$ using a THOMSON BLADE MIR-CI 23 (manufactured by Nakayama Corporation), and the presence or absence of the cut remainder was evaluated.

The results are shown in Table 1.

TABLE 1

| | Substrate film Oxygen permeability [cc/day/m$^2$/atm] | Monomer | Monomer ratio [%] | Initiator | Resin layer Moisture permeability 40° C. 90% [g/(m$^2$/day)] | Oxygen permeability [cc/day/m$^2$/atm] | UV dose [mJ/cm$^2$] |
|---|---|---|---|---|---|---|---|
| Example 1 | 4.0 × 10$^{-3}$ | U-4HA | 49 | Irg. 819 1% | 284.8 | 3 | 3000 |
| | | ADCP | 25 | | | | |
| | | 1.6HA-A | 25 | | | | |
| Example 2 | 4.0 × 10$^{-3}$ | 1.6HA-A | 99 | Irg. 819 1% | 568 | 18 | 3000 |
| Comparative Example 1 | 4.0 × 10$^{-3}$ | 1,9NDA | 99 | Irg. 819 1% | 480.4 | 20 | 3000 |

TABLE 1-continued

| | | | | | | | |
|---|---|---|---|---|---|---|---|
| Comparative Example 2 | $4.0 \times 10^{-3}$ | DPHA | 99 | Irg. 2022 1% | 562.6 | 3 | 3000 |
| Example 3 | $4.0 \times 10^{-3}$ | U-4HA | 48 | Irg. 819 1% | 217.3 | 2 | 3000 |
| | | CYCLOMER M100 | 25 | CPI-100P 1% | | | |
| | | ADCP | 25 | | | | |
| Comparative Example 3 | $4.0 \times 10^{-3}$ | ADCP | 99 | Irg. 819 1% | 144.7 | 5 | 3000 |
| Example 4 | $4.0 \times 10^{-3}$ | U4HA | 99 | Irg. 2022 1% | 280.2 | 2 | 3000 |
| Comparative Example 4 | $4.0 \times 10^{-3}$ | A-TMPT | 99 | Irg. 819 1% | 518.3 | 4 | 3000 |
| Example 5 | $4.0 \times 10^{-3}$ | U-4HA | 49 | Irg. 819 1% | — | 2.5 | 50000 |
| | | ADCP | 25 | | | | |
| | | 1,6HA-A | 25 | | | | |
| Example 6 | $4.0 \times 10^{-3}$ | U-4HA | 49 | Irg. 819 1% | — | 3.5 | 500 |
| | | ADCP | 25 | | | | |
| | | 1,6HA-A | 25 | | | | |
| Example 7 | $1.0 \times 10^{-1}$ | U-4HA | 49 | Irg. 819 1% | 284.8 | 3 | 3000 |
| | | ADCP | 25 | | | | |
| | | 1,6HA-A | 25 | | | | |

| | Resin layer | | | Evaluation | | | | | |
|---|---|---|---|---|---|---|---|---|---|
| | Knoop hardness [N/m$^2$] | Creep recovery rate [%] | Elastic recovery rate [%] | Initial luminance Y | 1000 hours after deterioration | 2000 hours after deterioration | Evaluation of luminance unevenness | Cut surface | Cut remainder |
| Example 1 | 200.9 | 19 | 67.8 | AA | A | A | A | A | Absent |
| Example 2 | 141.1 | 17.9 | 66.4 | A | A | A | A | A | Absent |
| Comparative Example 1 | 113.8 | 18.3 | 65.1 | A | B | C | A | B | Absent |
| Comparative Example 2 | 290.1 | 20.8 | 85.9 | — | — | — | — | A | Present |
| Example 3 | 203 | 15.2 | 63.1 | A | A | A | A | A | Absent |
| Comparative Example 3 | 194.5 | 12.8 | 59.7 | C | A | A | C | C | Absent |
| Example 4 | 233.4 | 21.1 | 68.1 | A | A | A | A | A | Absent |
| Comparative Example 4 | 240.9 | 22.9 | 77.9 | — | — | — | — | A | Present |
| Example 5 | 260.3 | 18.3 | 76.3 | B | A | A | B | A | Absent |
| Example 6 | 162.8 | 19 | 62.3 | A | A | B | A | A | Absent |
| Example 7 | 200.9 | 19 | 67.8 | AA | A | B | A | A | Absent |

From the comparison between Example 2 and Comparative Example 1, it can be seen that, in the case where the Knoop hardness is too small, it deteriorates at an early stage. This is thought to be because in the case where the Knoop hardness is too small, micro scratches also occur in a direction different from the direction in which cutting is desired, thus causing cracks.

Also, from the comparison between Example 1 and Comparative Example 2, it can be seen that the cut remainder appears in the case where the Knoop hardness is too large. This is probably because the load by the cutting blade is insufficient in the case where the Knoop hardness is too large.

Also, from the comparison between Example 3 and Comparative Example 3, it can be seen that, in the case where the elastic recovery rate is too small, the cut surface collapses, the initial luminance lowers, and luminance unevenness occurs. It is considered that, in the case where the elastic recovery rate is too small, shape recovery after cutting is delayed, resulting in film thickness unevenness and leading to luminance unevenness.

Further, from the comparison between Example 4 and Comparative Example 4, it can be seen that, in the case where the creep recovery rate is too large, the cut remainder appears. It is considered that, in the case where the creep recovery rate is too large, the viscoelastic behavior will appear and the cut remainder will appear.

Further, from the comparison of Examples 1, 5 and 6, it can be seen that Knoop hardness, creep recovery rate, and elastic recovery rate can be adjusted by appropriately setting the irradiation dose of ultraviolet irradiation in the case of curing the resin layer. Further, from the comparison between Example 1 and Example 2, it is possible to adjust the value of initial luminance by appropriately setting the value of oxygen permeability.

With respect to the phosphor-containing film according to the embodiment of the present invention, the wavelength converting member has been described as an example in the foregoing embodiments, but appropriate selection of the type of the phosphor can provide applications for an organic electroluminescence layer in an organic electroluminescence element, an organic photoelectric conversion layer in an organic solar cell, or the like, and can achieve an effect of suppressing performance deterioration.

EXPLANATION OF REFERENCES 1, 3, 4, 6: phosphor-containing film
10, 20: substrate film
11, 21: support film
12, 22: barrier layer
30: phosphor-containing layer
31, 31a, 31b, 31e: phosphors
32: coating liquid for forming fluorescent region
33: binder
35, 35a, 35b: region containing phosphors (fluorescent region)
37: coating liquid for resin layer 38: resin layer having impermeability to oxygen
50: transfer roller
52, 58, 62, 68: backup roller
54, 64: coating part
56, 66: cured part
59: lamination film
60: laminating roller
100: wavelength converting member
101A: light source
101B: light guide plate
101C: planar light source
102: backlight unit
102A: reflecting plate
102B: retroreflective member
103: liquid crystal cell unit
104: liquid crystal display
110: liquid crystal cell
120, 130: polarizing plate
121, 123, 131, 133: polarizing plate protective film
122, 132: polarizer

What is claimed is:

1. A phosphor-containing film comprising:
a phosphor-containing layer in which a plurality of fluorescent regions, each of which contains a phosphor that deteriorates through a reaction with oxygen in the case of being exposed to oxygen, are discretely arranged and a resin layer having impermeability to oxygen is arranged among the plurality of discretely arranged fluorescent regions; and
a first substrate film laminated on one main surface of the phosphor-containing layer and a second substrate film laminated on the other main surface of the phosphor-containing layer,
in which the resin layer has a Knoop hardness of 115 $N/mm^2$ to 285 $N/mm^2$, a creep recovery rate of 22% or less, and an elastic recovery rate of 60% or more,
wherein each of the fluorescent regions is formed by dispersing the phosphor in a binder, and
wherein each of the fluorescent regions containing the phosphor in which properties of the fluorescence deteriorate, and the resin layer, are exposed on an end face of the phosphor-containing film.

2. The phosphor-containing film according to claim 1, wherein the resin layer has an oxygen permeability of 10 $cc/(m^2 \cdot day \cdot atm)$ or less.

3. The phosphor-containing film according to claim 1, wherein the oxygen permeability of the first substrate film and the second substrate film is 1 $cc/(m^2 \cdot day \cdot atm)$ or less.

4. The phosphor-containing film according to claim 1, wherein a resin contained in the resin layer is formed of a composition containing a compound having a photopolymerizable functional group or a thermopolymerizable functional group.

5. A backlight unit comprising:
a wavelength converting member including the phosphor-containing film according to claim 1; and
at least one of a blue light emitting diode or an ultraviolet light emitting diode.

* * * * *